(12) United States Patent
Shigihara

(10) Patent No.: US 7,756,179 B2
(45) Date of Patent: Jul. 13, 2010

(54) SEMICONDUCTOR LASER APPARATUS

(75) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 167 days.

(21) Appl. No.: 12/031,027

(22) Filed: Feb. 14, 2008

(65) Prior Publication Data

US 2009/0080484 A1 Mar. 26, 2009

(30) Foreign Application Priority Data

Sep. 26, 2007 (JP) ............................. 2007-248887

(51) Int. Cl.
*H01S 5/00* (2006.01)
(52) U.S. Cl. .............. 372/45.01; 372/43.01; 372/44.01; 372/46.01
(58) Field of Classification Search .............. 372/43.01, 372/44.01, 45.01, 46.01
See application file for complete search history.

(56) References Cited

U.S. PATENT DOCUMENTS

| | | | | |
|---|---|---|---|---|
| 5,572,539 A | * | 11/1996 | Kondo | 372/45.01 |
| 6,195,375 B1 | * | 2/2001 | Hirata | 372/46.01 |
| 6,333,945 B1 | * | 12/2001 | Abe et al. | 372/46.01 |
| 6,778,573 B2 | * | 8/2004 | Hayakawa et al. | 372/43.01 |
| 7,289,546 B1 | * | 10/2007 | Shigihara et al. | 372/43.01 |
| 7,415,054 B2 | * | 8/2008 | Shigihara | 372/43.01 |
| 7,428,256 B2 | * | 9/2008 | Shigihara | 372/45.01 |
| 7,466,737 B2 | * | 12/2008 | Ma et al. | 372/45.01 |

OTHER PUBLICATIONS

Sebastian, J. et al.; "High-Power 810-nm GaAsP-AlGaAs Diode Laser With Narrow Beam Divergence", *IEEE J. on Selected Topics in Quantum Electronics*, vol. 7, No. 2, pp. 334-339, (Mar.-Apr. 2001).

* cited by examiner

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

A semiconductor laser apparatus can improve electric conversion efficiency to a satisfactory extent. The apparatus includes an n-type cladding layer, an n-type cladding layer side guide layer, an active layer, a p-type cladding layer side guide layer, and a p-type cladding layer, wherein electrons and holes are injected into the active layer, transverse to the active layer, through the n-type cladding layer side guide layer and the p-type cladding layer side guide layer. The p-type cladding layer side guide layer is thinner than the n-type cladding layer side guide layer to position the active layer closer to the p-type cladding layer, and, at the same time, the refractive index of the p-type cladding layer side guide layer is higher than the refractive index of the n-type cladding layer side guide layer.

3 Claims, 23 Drawing Sheets

1: n ELECTRODE
5: $Al_zGa_{1-z}As$ ACTIVE LAYER (z=0.10,10nm)
8: p-TYPE GaAs CONTACT LAYER
10: PROTON INJECTION REGION

- 1: n ELECTRODE
- 5: $Al_zGa_{1-z}As$ ACTIVE LAYER (z=0.10, 10nm)
- 8: p-TYPE GaAs CONTACT LAYER
- 10: PROTON INJECTION REGION

13: In$_z$Ga$_{1-z}$As ACTIVE LAYER (z=0.20,10nm)

18: $In_zGa_{1-z}As$ ACTIVE LAYER (z=0.10,10nm)

33: In$_{1-z}$Ga$_z$P ACTIVE LAYER (z=0.44, 10nm)

54: GaAs$_{1-z}$P$_z$ ACTIVE LAYER (z=0.12, 14nm)

SEMICONDUCTOR LASER APPARATUS

BACKGROUND OF THE INVENTION

1. Field of the Invention

The present invention relates to a semiconductor laser apparatus for information processing for writing DVDs, or a semiconductor laser apparatus for an pumping light source or for optical communication, such as a solid state laser (e.g., an Nd doped YAG (Nd:YAG) laser, a Yb doped YAG (Yb:YAG) laser, or the like), a Yb-doped fiber laser, an Er doped fiber amplifier, etc.

2. Description of the Related Art

Conventionally, in order to provide a semiconductor laser apparatus capable of high output operation, there has been proposed a structure in which an active layer of GaAsP is sandwiched between a pair of optical guide layers of $Al_xGa_{1-x}As$ having the same thickness and composition (see, for example, a later-mentioned first non-patent document).

In addition, in such a kind of semiconductor laser apparatus, the slope or gradient of a carrier distribution in a p-side guide layer is μn/μp of that of a carrier distribution in an n-side guide layer (see, for example, a later-mentioned second non-patent document).

[First Non-patent Document]

J. Sebastian, et. al., "High-Power 810-nm GaAsP—AlGaAs Diode Lasers With Narrow Beam Divergence", IEEE J. Select. Topics Quantum Electron., vol. 7, No. 2, pp. 334-339, 2001

[Second Non-patent Document]

M. Alamand, M. Lundstrom, "Simple Analysis of Carrier Transport and Buildup in Separate Confinement Heterostructure Quantum Well Lasers", IEEE Photonics Technol. Let., vol. 6, No. 12, pp. 1418-1420, 1994

In the conventional semiconductor laser apparatus, there is an increasing demand for improving an electric conversion efficiency (optical output/input electric power) so as to reduce power consumption, but there has been a problem that a technique for reducing optical absorption by increasing the thickness of the guide layers for improved slope efficiency,

SUMMARY OF THE INVENTION

In view of the above, the object of the present invention is to obtain a semiconductor laser apparatus which is capable of improving electric conversion efficiency to a satisfactory extent so as to satisfy the above-mentioned demand.

A semiconductor laser apparatus according to the present invention includes an n-type clad layer, an n-type clad layer side guide layer, an active layer, a p-type clad layer side guide layer, and a p-type clad layer, wherein electrons and holes are injected into the active layer in a vertical direction with respect thereto through the n-type clad layer side guide layer and the p-type clad layer side guide layer. The thickness of the p-type clad layer side guide layer is set to be thinner than the thickness of the n-type clad layer side guide layer, so that the position of the active layer is arranged close to the p-type clad layer, and at the same time, the refractive index of the p-type clad layer side guide layer is set to be higher than the refractive index of the n-type clad layer side guide layer.

According to the present invention, by arranging the active layer close to a p-type clad layer side, and setting the refractive index of the p-type clad layer side guide layer to a large value, it is possible to reduce optical absorption into the guide layers while suppressing the reduction of optical confinement rate with respect to the active layers, whereby the electric conversion efficiency of the semiconductor laser apparatus can be raised.

The above and other objects, features and advantages of the present invention will become more readily apparent to those skilled in the art from the following detailed description of preferred embodiments of the present invention taken in conjunction with the accompanying drawings.

DESCRIPTION OF THE PREFERRED EMBODIMENTS

Hereinafter, preferred embodiments of the present invention will be described in detail while referring to the accompanying drawings.

Embodiment 1

Figure 1:
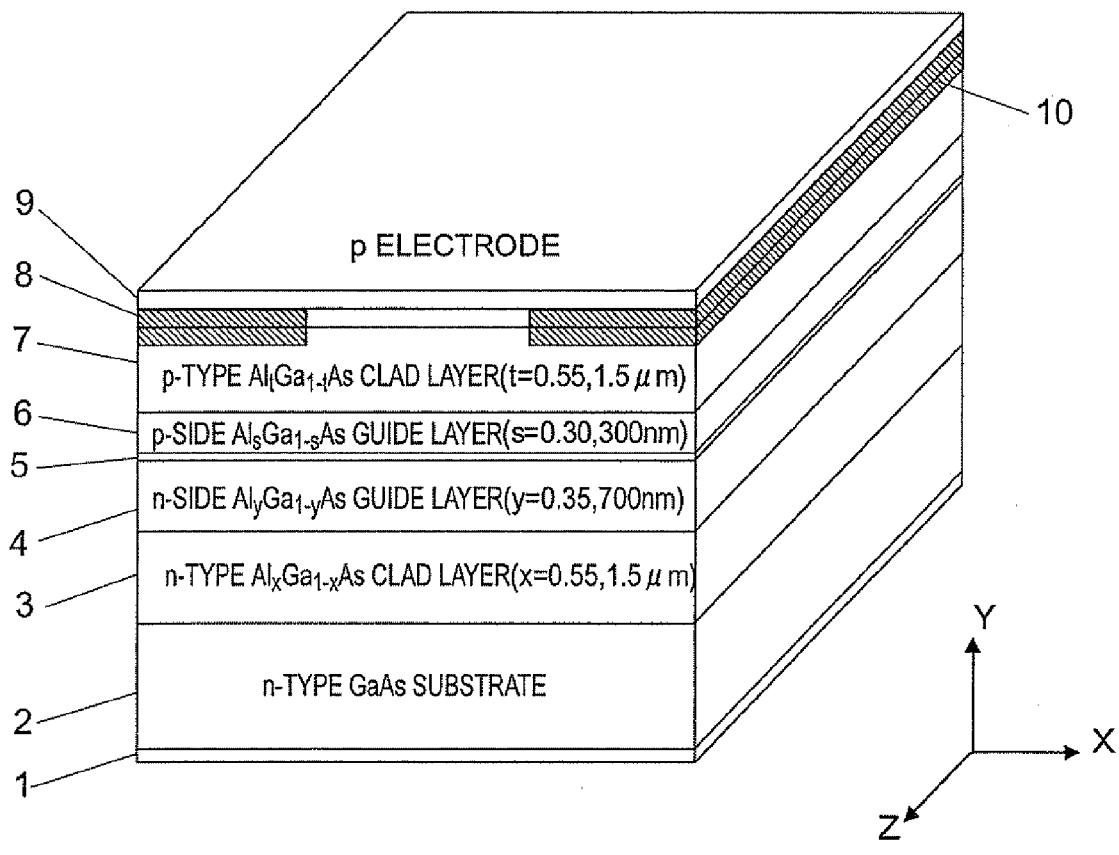
FIG. 1 is a perspective view showing a semiconductor laser apparatus according to a first embodiment of the present invention.

Referring to the drawings and first to FIG. 1, there is shown, in a perspective view, a semiconductor laser apparatus with an oscillation wavelength band of 810 nm for example according to a first embodiment of the present invention.

In FIG. 1, the semiconductor laser apparatus includes, in the order from the bottom to the top, an n electrode 1, an n-type GaAs substrate 2, an n-type $Al_xGa_{1-x}As$ clad layer (n-type clad layer) 3, an n-side $Al_yGa_{1-y}As$ guide layer (n-type clad layer side guide layer) 4, an $Al_zGa_{1-z}As$ active layer (active layer) 5, a p-side $Al_sGa_{1-s}As$ guide layer (p-type clad layer side guide layer) 6, a p-type $Al_tGa_{1-t}As$ clad layer (p-type clad layer) 7, and a p-type GaAs contact layer 8, and a p electrode 9.

In addition, a proton injection region 10 extended in a Z axis (in an emission direction of a laser beam) is formed on the side portions of the p-type $Al_tGa_{1-t}As$ clad layer 7 and the p-type GaAs contact layer 8.

The n-type clad layer 3 has an Al composition ratio x of 0.55 and a layer thickness of 1.5 µm. The n-type clad layer side guide layer (n-side guide layer) 4 has an Al composition ratio y of 0.35 and a layer thickness of 700 nm. The active layer 5 has an Al composition ratio z of 0.10 and a layer thickness of 10 nm. The p-type clad layer side guide layer (p-side guide layer) 6 has an Al composition ratio s of 0.30 and a layer thickness of 300 nm. The p-type clad layer 7 has an Al composition ratio t of 0.55 and a layer thickness of 1.5 µm.

Impurities are not doped intentionally into the n-side guide layer 4 and the p-side guide layer 6 in the course of crystal growth and wafer processing, so these layers 4, 6 are in an undoped state or in a state near an undoped state.

Here, reference will be made to a basic operation of the semiconductor laser apparatus shown in FIG. 1.

First of all, a bias in the forward direction is applied to the p electrode 9 and the n electrode 1. That is, a positive voltage is applied to the p electrode 9, and a voltage equal to or less than the positive voltage, e.g., a negative voltage, is applied to the n electrode 1.

Under such a condition, electrons are injected from the n-type $Al_xGa_{1-x}As$ clad layer 3 into the $Al_zGa_{1-z}As$ active layer 5 in a vertical direction with respect thereto through the n-side $Al_yGa_{1-y}As$ guide layer 4. In addition, holes (positive holes) are injected from the p-type $Al_tGa_{1-t}As$ clad layer 7 into the $Al_zGa_{1-z}As$ active layer 5 in a vertical direction with respect thereto through the p-side $Al_sGa_{1-s}As$ guide layer 6, whereby a laser beam is emitted from the $Al_zGa_{1-z}As$ active layer 5 to in Z-axis directions, i.e., in two (positive and negative) directions.

Figure 2:
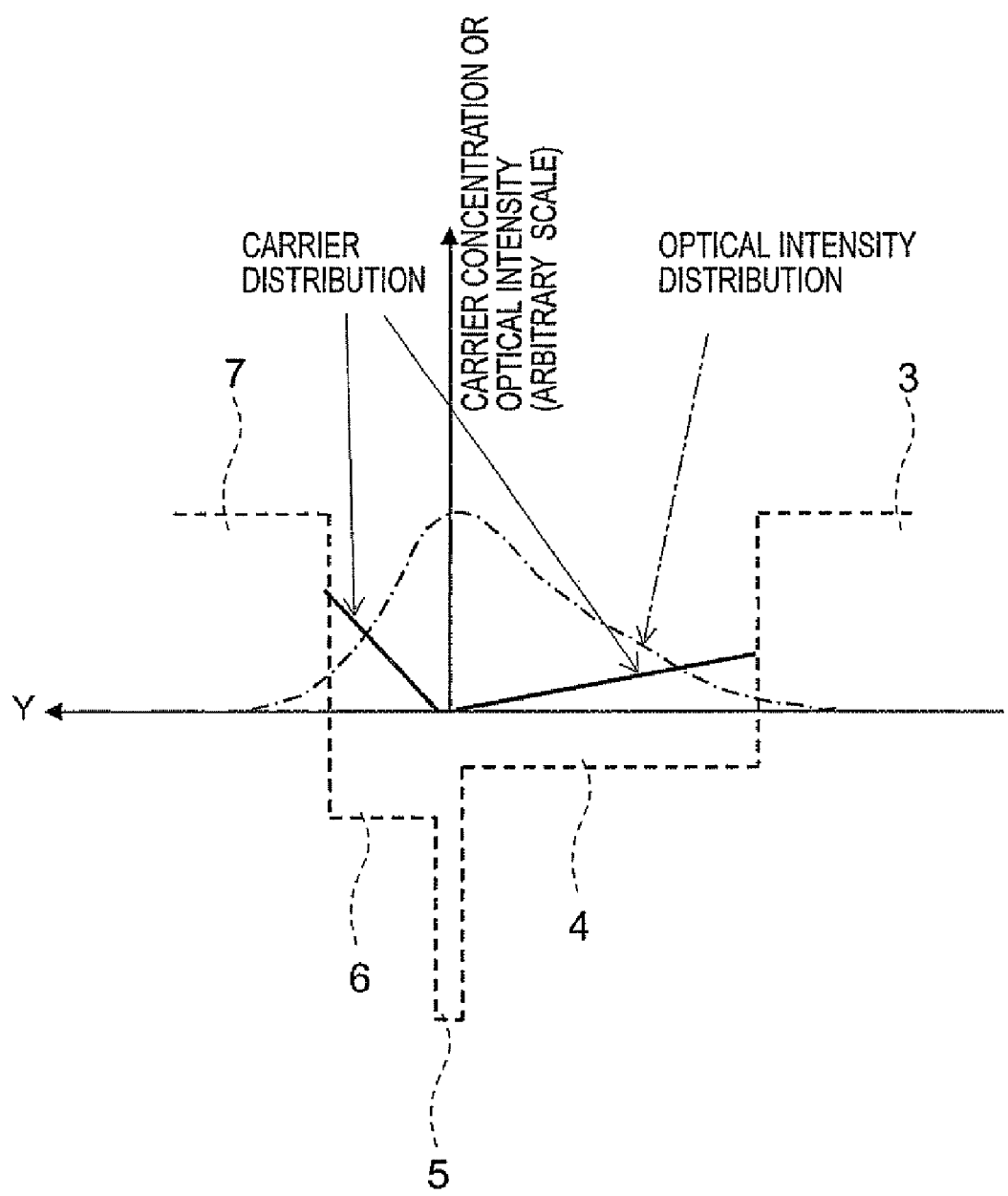
FIG. 2 is an explanatory view showing a carrier distribution and an optical intensity distribution in the semiconductor laser apparatus according to the first embodiment of the present invention.

FIG. 2 is an explanatory view that diagrammatically shows the optical intensity distribution (see an alternate long and short dash line) of the semiconductor laser apparatus of FIG. 1, wherein the optical intensity distribution of a near field pattern (NFP) decided by the distribution (see a thick solid line) of carriers (electrons and holes) and the refractive distribution in each of the n-side $Al_yGa_{1-y}As$ guide layer (n-side guide layer) 4 and the p-side $Al_sGa_{1-s}As$ guide layer (p-side guide layer) 6 is illustrated.

In FIG. 2, a broken line indicates the band structure of conduction bands (the individual clad layers 3, 7, the individual guide layers 4, 6, and the active layer 5), and a thick solid line indicates the carrier distribution (carrier density or concentration) of the electrons and the holes, and an alternate long and short dash line indicates the distribution of optical intensity.

In general, from the need that the condition of electric charge neutrality has to be kept in the individual guide layers 4, 6, respectively, the electron density or concentration n(y) and the hole density or concentration p(y) at an arbitrary position (y) on the Y axis are the same value with respect to each other. That is, the numbers of electrons and holes existing in each of the guide layers 4, 6 at an arbitrary position (y) on the Y axis are always the same, so a relation of n(y)=p(y) holds.

In addition, assuming that the center of the active layer 5 is an origin of the Y-axis, as shown in FIG. 2, the carrier density (see the thick solid line) becomes the smallest in a place where the guide layers 4, 6 are in contact with the active layer 5, and it increases in a straight line as the guide layers 4, 6 go toward the individual clad layers 3, 7, respectively.

Further, assuming that the individual mobilities of electrons and holes are µn and µp, respectively, the slope of the carrier distribution (see the thick solid line to the left side in FIG. 2) in the p-side guide layer 6 is µn/µp of the slope of the carrier distribution (see the thick solid line to the right side in FIG. 2) in the n-side guide layer 4 (see, for example, the above-mentioned second non-patent document).

In addition, in FIG. 2, the optical intensity distribution (see the alternate long and short dash line) is in an asymmetrical shape in which it is drawn to the active layer 5 and the p-side guide layer 6 (the refractive indexes thereof are set to higher values).

Figure 3:
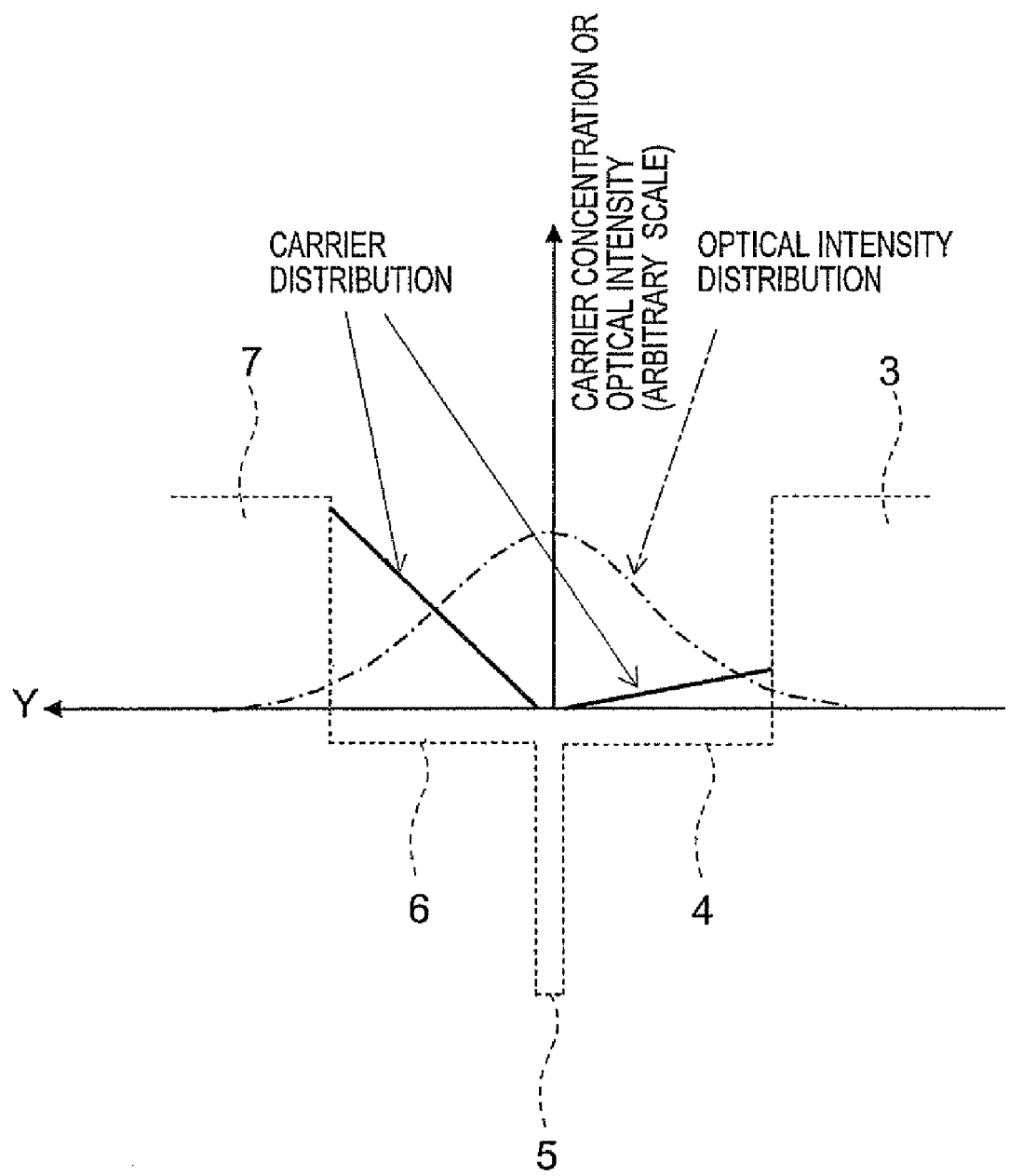
FIG. 3 is an explanatory view showing a carrier distribution and an optical intensity distribution in a general semiconductor laser apparatus for comparison with those in the first embodiment of the present invention.

FIG. 3 is an explanatory view which shows a carrier distribution and an optical intensity distribution in a general semiconductor laser apparatus, and which is for comparison with the optical intensity distribution (see FIG. 2) according to the first embodiment of the present invention.

In FIG. 3, there are shown the carrier distribution and the optical intensity distribution in case where an n-side $Al_yGa_{1-y}As$ guide layer 4 and a p-side $Al_sGa_{1-s}As$ guide layer 6 respectively have equal Al composition ratios y, s and an equal layer thickness (Al composition ratio: y=s=0.30, and layer thickness=500 nm).

In FIG. 3, similar to FIG. 2, the carrier density (carrier distribution: see the thick solid line) becomes the smallest in a place where the guide layers 4, 6 are in contact with an active layer 5, and it increases in a straight line as the guide layers 4, 6 go toward individual clad layers 3, 7, respectively. However, in case of FIG. 3, the layer thickness (500 nm) of the p-side guide layer 6 is larger than that (300 nm) in the first embodiment (FIGS. 1 and 2) of the present invention, so it is found that the slope of the carrier distribution in the p-side guide layer 6 becomes μn/μp of the slope of the carrier distribution in the n-side guide layer 4, and hence that a lot of carriers exist in the p-side guide layer 6 in comparison with the case of FIG. 2. In addition, the optical intensity distribution (see the alternate long and short dash line) is distributed in symmetry with respect to the active layer 5, unlike the case of FIG. 2.

On the other hand, in the first embodiment of the present invention, the thickness (300 nm) of the p-side guide layer 6 is set to be relatively thin, and the thickness (700 nm) of the n-side guide layer 4 is set to be relatively thick, so the carrier density in the p-side guide layer 6 can be greatly reduced, as shown in FIG. 2.

As a result, optical absorption due to the carriers in each of the guide layers 4, 6 can be reduced, and consequently, the slope efficiency (i.e., the slope of the increment of an optical output per unit drive current) can be improved.

In addition, the refractive index of the p-side $Al_sGa_{1-s}As$ guide layer (s=0.30) 6 is set to a value that is higher than the refractive index of the n-side $Al_yGa_{1-y}As$ guide layer (y=0.35) 4, whereby the center of the optical intensity distribution (see the alternate long and short dash line in FIG. 2) is set to a location in the vicinity of the active layer 5. By making the light intensity distribution itself into an asymmetrical shape, it is possible to suppress the reduction of an optical confinement rate (i.e., a rate of the optical density confined in the active layer 5). As a result, a semiconductor laser apparatus with high electrical conversion efficiency can be achieved without causing an increase in a threshold current.

Moreover, the individual n-side and p-side guide layers 4, 6 are not subjected to the intentional doping of p-type or n-type dopants (impurities), and are in an undoped state (or in a state close to undoped). This means a state in which intentional doping is not performed, and it may not be a completely undoped state, but include a state close to an undoped state. Therefore, the individual n-side and p-side guide layers 4, 6 can avoid the loss resulting from the dopant concentration, and can further improve the electric conversion efficiency.

Although in FIG. 1, a proton injection method is applied as a current constriction or narrowing method for forming the proton injection region 10 so as to raise the oscillation efficiency, it is needless to say that the present invention is not limited to such a method, but a stripe formation method using insulating films or a method using a waveguide for ridge formation, etc., can also be applied, and further, a method of inserting a current block layer such as embedding an n-GaAs semiconductor layer, etc., can be applied.

In addition, the thickness and composition of the above-mentioned individual layers 3 through 7 are one example, and the present invention is not limited to this.

Embodiment 2

Figure 4:
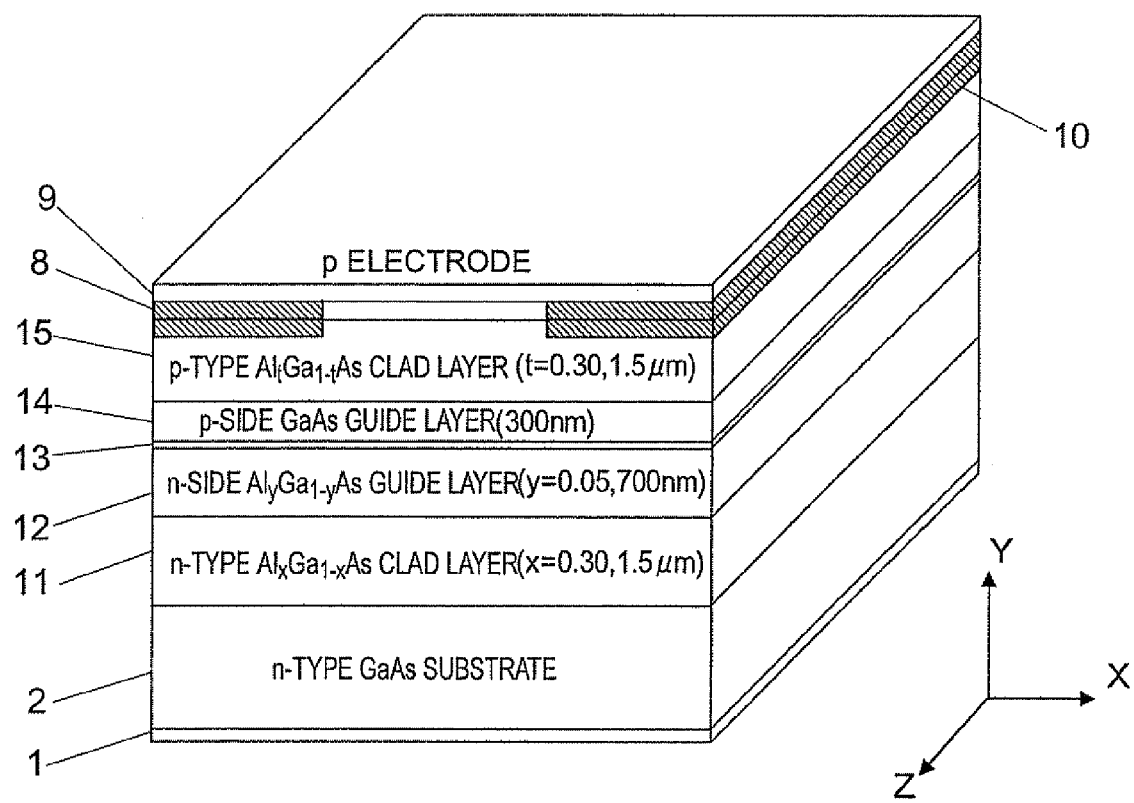
FIG. 4 is a perspective view showing a semiconductor laser apparatus according to a second embodiment of the present invention.

In the above-mentioned first embodiment (FIG. 1), the $Al_zGa_{1-z}As$ active layer 5 is used as an active layer, and the p-side $Al_sGa_{1-s}As$ guide layer 6 is used as a p-side guide layer, but an $Al_zGa_{1-z}As$ active layer 13 and a p-side GaAs guide layer (Al composition ratio=0) 14 may instead be used, as shown in FIG. 4.

FIG. 4 is a perspective view that shows a second embodiment of the present invention, wherein a semiconductor laser apparatus with an oscillation wavelength band of 980 nm for example is illustrated. In FIG. 4, the same or like parts or elements as those described above (see FIG. 1) are identified by the same symbols while omitting a detailed description thereof.

In this case, the semiconductor laser apparatus includes an n-type $Al_xGa_{1-x}As$ clad layer 11, an n-side $Al_yGa_{1-y}As$ guide layer 12, the $Al_zGa_{1-z}As$ active layer 13, the p-side GaAs guide layer 14 and a p-type $Al_tGa_{1-t}As$ clad layer 15, in addition to the above-mentioned individual layers 1, 2, 8 through 10 and as layers different in composition from the above-mentioned individual layers 3 through 7.

The n-type clad layer 11 has an Al composition ratio x of 0.30 and a layer thickness of 1.5 μm. The n-side guide layer 12 has an Al composition ratio y of 0.05 and a layer thickness of 700 nm. The active layer 13 has an In composition ratio z of 0.20 and a layer thickness of 10 nm. The p-side guide layer 14 has a layer thickness of 300 nm. The p-type clad layer 15 has an Al composition ratio t of 0.30 and a layer thickness of 1.5 μm.

In FIG. 4, the thickness (=300 nm) of the p-side GaAs guide layer 14 is set to be thinner than the thickness (=700 nm) of the n-side guide layer (AlGaAs) 12, and hence the center position of the active layer 13 is shifted to the side of the p-type clad layer 15, so the carriers in the p-side guide layer 14 decrease. As a result, the absorption of a laser beam by the carriers is decreased, and the slope efficiency is improved.

In addition, the refractive index of the p-side GaAs guide layer 14 is set to a value that is higher than the refractive index of the n-side $Al_yGa_{1-y}As$ guide layer (y=0.05) 12, so the optical intensity distribution becomes asymmetric while being biased to the p-side guide layer 14 as mentioned above (see FIG. 2), and the reduction of an optical confinement rate is not induced. As a result, a semiconductor laser apparatus with high electrical conversion efficiency can be achieved without causing an increase in a threshold current.

As described above, according to the second embodiment (FIG. 4) of the present invention, similar to the above-mentioned first embodiment, the thickness (300 nm) of the p-type clad layer side guide layer 14 is set to be thinner than the thickness (700 nm) of the n-type clad layer side guide layer 12 thereby to make the center position of the active layer 13 closer to the p-type clad layer 15, and at the same time, the refractive index of the p-type clad layer side guide layer 14 is set to be higher than the refractive index of the n-type clad layer side guide layer 12. With this arrangement, the optical absorption of the carriers in the individual guide layers 12, 14 can be decreased while suppressing the reduction of the optical confinement rate of the active layer 13, whereby the electric conversion efficiency of the semiconductor laser apparatus can be raised.

Although a proton injection method similar to the above-mentioned is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 11 through 15 are one example, and the present invention is not limited to this.

Embodiment 3

Figure 5:
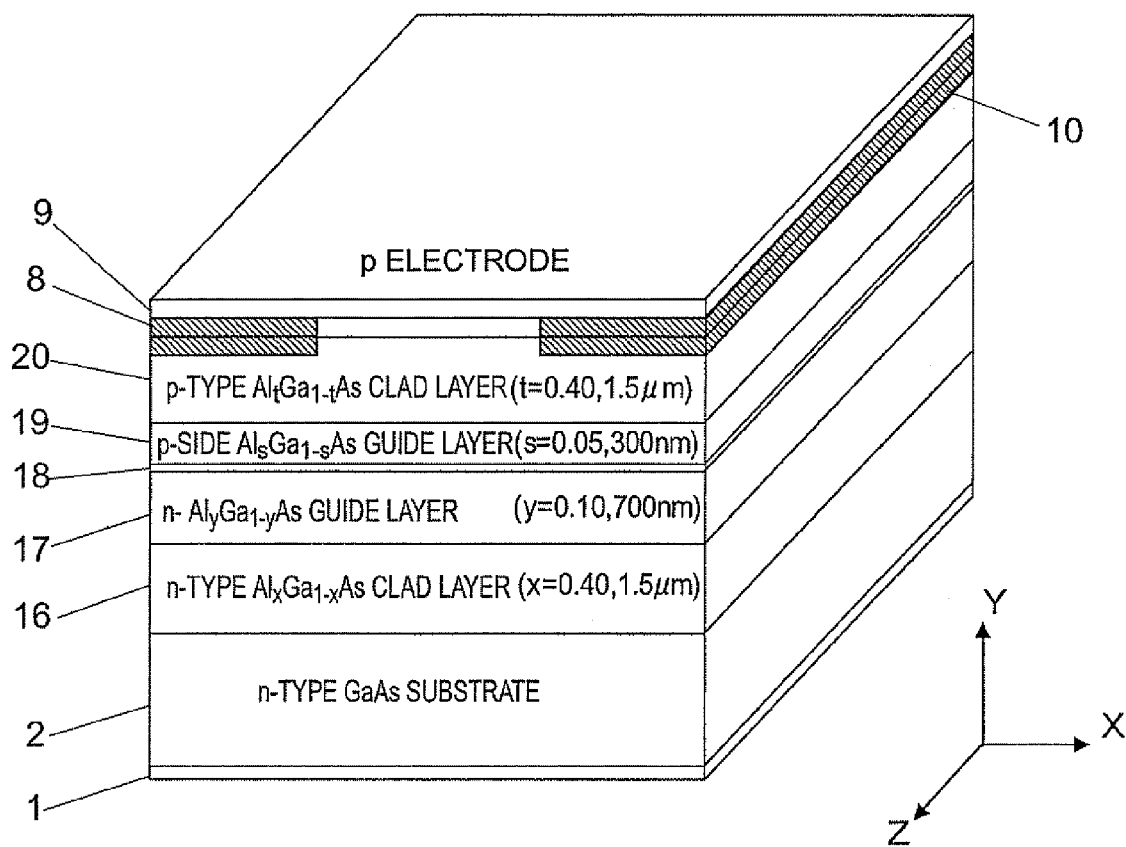
FIG. 5 is a perspective view showing a semiconductor laser apparatus according to a third embodiment of the present invention.

Although in the above-mentioned second embodiment (FIG. 4), the p-side GaAs guide layer 14 is used as a p-side guide layer, a p-side $Al_sGa_{1-s}As$ guide layer 19 may instead be used, as shown in FIG. 5.

FIG. 5 is a perspective view that shows a third embodiment of the present invention, wherein a semiconductor laser apparatus with an oscillation wavelength band of 940 nm for example is illustrated. In FIG. 5, the same or like parts or elements as those described above (see FIG. 4) are identified by the same symbols while omitting a detailed description thereof.

In this case, the semiconductor laser apparatus includes an n-type $Al_xGa_{1-x}As$ clad layer 16, an n-side $Al_yGa_{1-y}As$ guide layer 17, an $In_zGa_{1-z}As$ active layer 18, the p-side $Al_sGa_{1-s}As$ guide layer 19 and a p-type $Al_tGa_{1-t}As$ clad layer 20, in addition to the above-mentioned individual layers 1, 2, 8 through 10 and as layers different in composition from the above-mentioned individual layers 11 through 5.

The n-type clad layer 16 has an Al composition ratio x of 0.40 and a layer thickness of 1.5 μm. The n-side guide layer 17 has an Al composition ratio y of 0.10 and a layer thickness of 700 nm. The active layer 18 has an In composition ratio z of 0.10 and a layer thickness of 10 nm. The p-side guide layer 19 has an Al composition ratio s of 0.05 and a layer thickness of 300 nm. The p-type clad layer 20 has an Al composition ratio t of 0.40 and a layer thickness of 1.5 μm.

In FIG. 5, similar to the above-mentioned second embodiment, the thickness (=300 nm) of the p-side guide layer 19 is set to be thinner than the thickness (=700 nm) of the n-side guide layer 17, and hence the center position of the $In_zGa_{1-z}As$ active layer 18 is shifted to the side of the p-type clad layer 20, so the carriers in the p-side guide layer 19 decrease. As a result, the absorption of a laser beam by the carriers is decreased, and the slope efficiency is improved.

In addition, the refractive index of the p-side $Al_sGa_{1-s}As$ guide layer (s×0.05) 19 is set to a value that is higher than the refractive index of the n-side $Al_yGa_{1-y}As$ guide layer (y=0.10) 17, so the optical intensity distribution becomes asymmetric while being biased to the p-side guide layer 19 as mentioned above (see FIG. 2), and the reduction of an optical confinement rate is not induced. As a result, a semiconductor laser apparatus with high electrical conversion efficiency can be achieved without causing an increase in a threshold current.

As described above, according to the third embodiment (FIG. 5) of the present invention, similar to the above-mentioned first and second embodiments, the thickness (300 nm) of the p-type clad layer side guide layer 19 is set to be thinner than the thickness (700 nm) of the n-type clad layer side guide layer 17 thereby to make the center position of the $In_zGa_{1-z}As$ active layer 18 closer to the p-type clad layer 20, and at the same time, the refractive index of the p-side guide layer 19 is set to be higher than the refractive index of the n-side guide layer 17. With this arrangement, the optical absorption of the carriers in the individual guide layers 17, 19 can be decreased while suppressing the reduction of the optical confinement rate of the active layer 18, whereby the electric conversion efficiency of the semiconductor laser apparatus can be raised.

Although a proton injection method similar to the above-mentioned is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 16 through 20 are one example, and the present invention is not limited to this.

Embodiment 4

Figure 6:
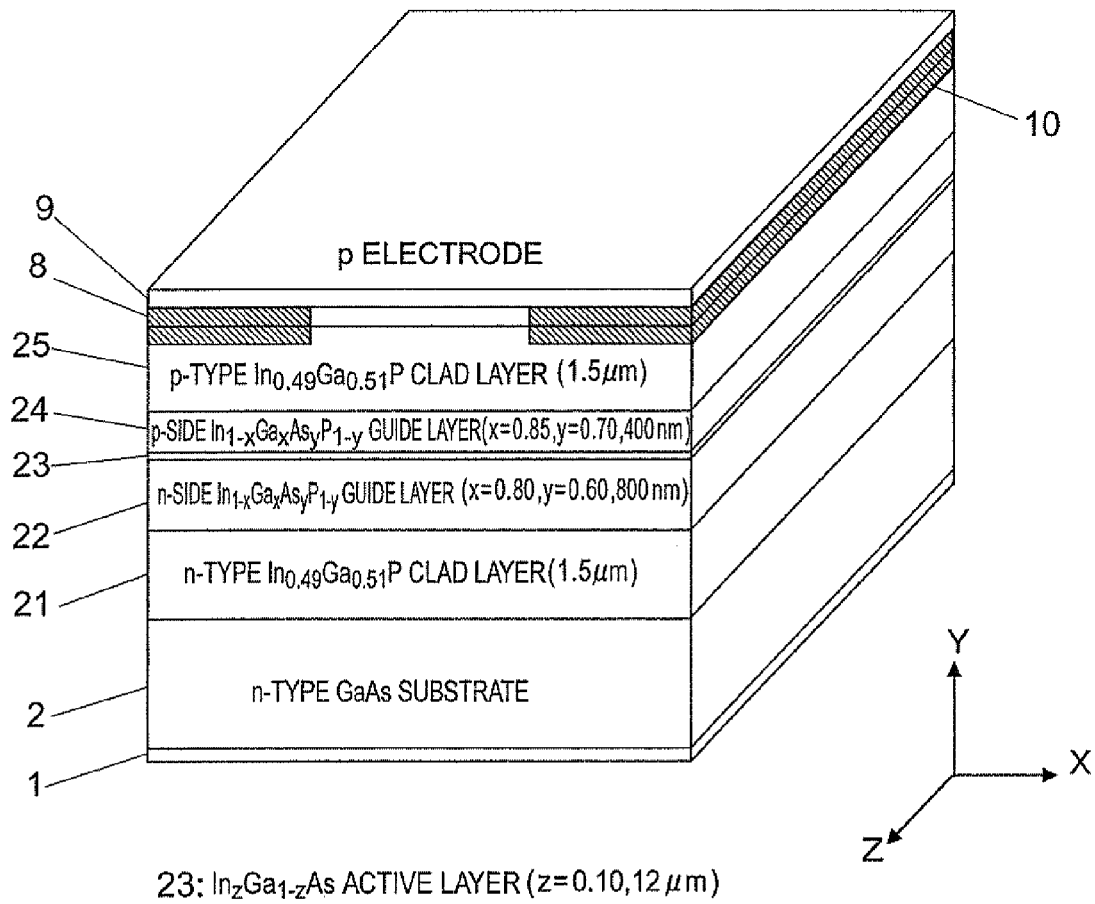
FIG. 6 is a perspective view showing a semiconductor laser apparatus according to a fourth embodiment of the present invention.

Although in the above-mentioned third embodiment (FIG. 5), the n-type $Al_xGa_{1-x}As$ clad layer 16 and the p-type $Al_tGa_{1-t}As$ clad layer 20 are used as individual clad layers, and the n-side $Al_yGa_{1-y}As$ guide layer 17 and the p-side $Al_sGa_{1-s}As$ guide layer 19 are used as individual guide layers, an n-type $In_{0.49}Ga_{0.51}P$ clad layer 21, a p-type $In_{0.49}Ga_{0.51}P$ clad layer 25, an n-side $In_{1-x}Ga_xAs_yP_{1-y}$ guide layer 22 and a p-side $In_{1-x}Ga_xAs_yP_{1-y}$ guide layer 24 may be used, as shown in FIG. 6.

FIG. 6 is a perspective view that shows a fourth embodiment of the present invention, wherein a semiconductor laser apparatus with an oscillation wavelength band of 940 nm for example is illustrated. In FIG. 6, the same or like parts or elements as those described above (see FIG. 5) are identified by the same symbols while omitting a detailed description thereof.

In this case, the semiconductor laser apparatus includes an n-type $In_{0.49}Ga_{0.51}P$ clad layer 21, the n-side $In_{1-x}Ga_xAs_yP_{1-y}$ guide layer 22, an $In_zGa_{1-z}As$ active layer 23, the p-side $In_{1-x}Ga_xAs_yP_{1-y}$ guide layer 24 and the p-type $In_{0.49}Ga_{0.51}P$ clad layer 25, in addition to the above-mentioned individual layers 1, 2, 8 through 10 and as layers different in composition from the above-mentioned individual layers 16 through 20.

The n-type clad layer 21 has a layer thickness of 1.5 μm. The n-side guide layer 22 has a Ga composition ratio x of 0.80, an As composition ratio y of 0.60 and a layer thickness of 800 nm. The active layer 23 has an In composition ratio z of 0.10 and a layer thickness of 12 nm. The p-side guide layer 24 has a Ga composition ratio x of 0.85, a Ga composition ratio y of 0.70 and a layer thickness of 400 nm. The p-type clad layer 25 has a layer thickness of 1.5 μm.

In FIG. 6, too, the thickness (=400 nm) of the p-side guide layer (InGaAsP) 24 is set to be thinner than the thickness (=800 nm) of the n-side guide layer (InGaAsP) 22, and hence the center position of the $In_zGa_{1-z}As$ active layer 23 is shifted to the side of the p-type clad layer 25, so the carriers in the p-side guide layer 24 decrease. As a result, the absorption of a laser beam by the carriers is decreased, and the slope efficiency is improved.

In addition, the refractive index of the p-side $In_{1-x}Ga_xAs_yP_{1-y}$ guide layer (x=0.85, y=0.70) 24 is set to a value that is higher than the refractive index of the n-side $In_{1-x}Ga_xAs_yP_{1-y}$ guide layer (x=0.80, y=0.60) 22, so the optical intensity distribution becomes asymmetric while being biased to the p-side guide layer 24 as mentioned above (see FIG. 2), and the reduction of an optical confinement rate is not induced. As a result, a semiconductor laser apparatus with high electrical conversion efficiency can be achieved without causing an increase in a threshold current. Here, note that the As composition ratio and the Ga composition ratio of the individual guide layers (InGaAsP) 22, 24 are set so as to have their lattice constants substantially equal to the lattice constant of GaAs.

As described above, according to the fourth embodiment (FIG. 6) of the present invention, similar to the above-mentioned first through third embodiments, the thickness (400 nm) of the p-type clad layer side guide layer 24 is set to be thinner than the thickness (800 nm) of the n-type clad layer side guide layer 22 thereby to make the center position of the $In_zGa_{1-z}As$ active layer 23 closer to the p-type clad layer 25, and at the same time, the refractive index of the p-side guide layer 24 is set to be higher than the refractive index of the n-side guide layer 22. With this arrangement, the optical absorption of the carriers in the individual guide layers 22, 24 can be decreased while suppressing the reduction of the optical confinement rate of the active layer 23, whereby the electric conversion efficiency of the semiconductor laser apparatus can be raised.

Although a proton injection method similar to the above-mentioned is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 21 through 25 are one example, and the present invention is not limited to this.

Embodiment 5

Figure 7:
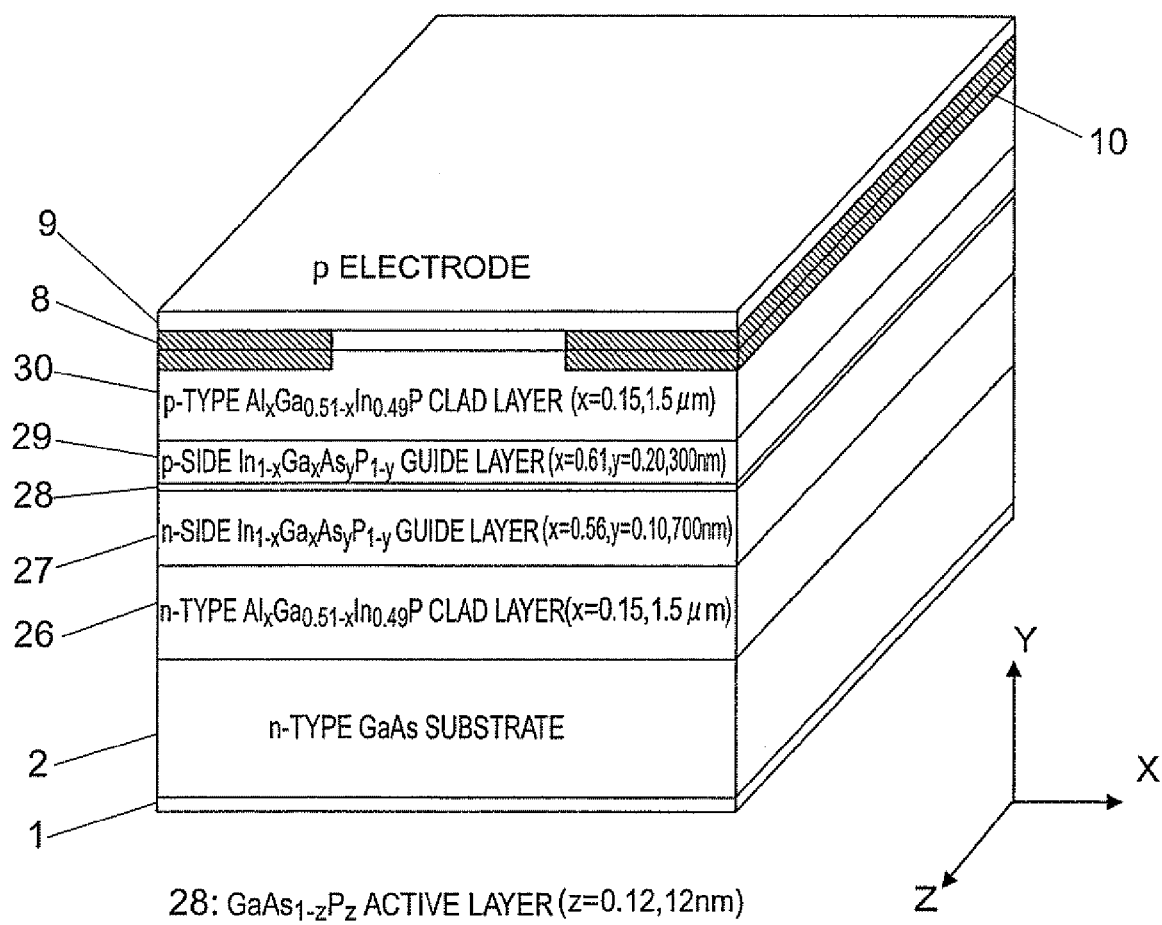
FIG. 7 is a perspective view showing a semiconductor laser apparatus according to a fifth embodiment of the present invention.

Although in the above-mentioned fourth embodiment (FIG. 6), the n-type $In_{0.49}Ga_{0.51}P$ clad layer 21 and the p-type $In_{0.49}Ga_{0.51}P$ clad layer 25 are used as individual clad layers, and the $In_zGa_{1-z}As$ active layer 23 is used as an active layer, an n-type $Al_xGa_{0.51-x}In_{0.49}P$ clad layer 26, a p-type $Al_xGa_{0.51-x}In_{0.49}P$ clad layer 30 and a $GaAs_{1-z}P_z$ active layer 28 may instead be used, as shown in FIG. 7.

FIG. 7 is a perspective view that shows a fifth embodiment of the present invention, wherein a semiconductor laser apparatus with an oscillation wavelength band of 810 nm for example is illustrated. In FIG. 7, the same or like parts or elements as those described above (see FIG. 6) are identified by the same symbols while omitting a detailed description thereof.

In this case, the semiconductor laser apparatus includes an n-type $Al_xGa_{0.51-x}In_{0.49}P$ clad layer 26, an n-side $In_{1-x}Ga_xAs_yP_{1-y}$ guide layer 27, a $GaAs_{1-z}P_z$ active layer 28, a p-side $In_{1-x}Ga_xAs_yP_{1-y}$ guide layer 29 and a p-type $Al_xGa_{0.51-x}In_{0.49}P$ clad layer 30, in addition to the above-mentioned individual layers 1, 2, 8 through 10 and as layers different in composition from the above-mentioned individual layers 21 through 25.

The n-type clad layer 26 has an Al composition ratio x of 0.15 and a layer thickness of 1.5 μm. The n-side guide layer 27 has a Ga composition ratio x of 0.56, an As composition ratio y of 0.10 and a layer thickness of 700 nm. The active layer 28 has a P composition ratio z of 0.12 and a layer thickness of 12 nm. The p-side guide layer 29 has a Ga composition ratio x of 0.61, an As composition ratio y of 0.20 and a layer thickness of 300 nm. The p-type clad layer 30 has an Al composition ratio x of 0.15 and a layer thickness of 1.5 μm.

In FIG. 7, too, the thickness (=300 nm) of the p-side guide layer (InGaAsP) 29 is set to be thinner than the thickness (=700 nm) of the n-side guide layer (InGaAsP) 27, and hence the center position of the $GaAs_{1-z}P_z$ active layer 28 is shifted to the side of the p-type clad layer 30, so the carriers in the p-side guide layer 29 decrease. As a result, the absorption of a laser beam by the carriers is decreased, and the slope efficiency is improved.

In addition, the refractive index of the p-side $In_{1-x}Ga_xAs_yP_{1-y}$ guide layer (x=0.61, y=0.20) 29 is set to a value that is higher than the refractive index of the n-side $In_{1-x}Ga_xAs_yP_{1-y}$ guide layer (x=0.56, y=0.10) 27, so the optical intensity distribution becomes asymmetric while being biased to the p-side guide layer 29 as mentioned above (see FIG. 2), and the reduction of an optical confinement rate is not induced. As a result, a semiconductor laser apparatus with high electrical conversion efficiency can be achieved without causing an increase in a threshold current.

As described above, according to the fifth embodiment (FIG. 7) of the present invention, similar to the above-mentioned first through fourth embodiments, the thickness (300 nm) of the p-type clad layer side guide layer 29 is set to be thinner than the thickness (700 nm) of the n-type clad layer side guide layer 27 thereby to make the center position of the $GaAs_{1-z}P_z$ active layer 28 closer to the p-type clad layer 30, and at the same time, the refractive index of the p-side guide layer 29 is set to be higher than the refractive index of the n-side guide layer 27. With this arrangement, the optical absorption of the carriers in the individual guide layers 27, 29 can be decreased while suppressing the reduction of the optical confinement rate of the active layer 30, whereby the electric conversion efficiency of the semiconductor laser apparatus can be raised.

Although a proton injection method similar to the above-mentioned is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 26 through 30 are one example, and the present invention is not limited to this.

Embodiment 6

Figure 8:
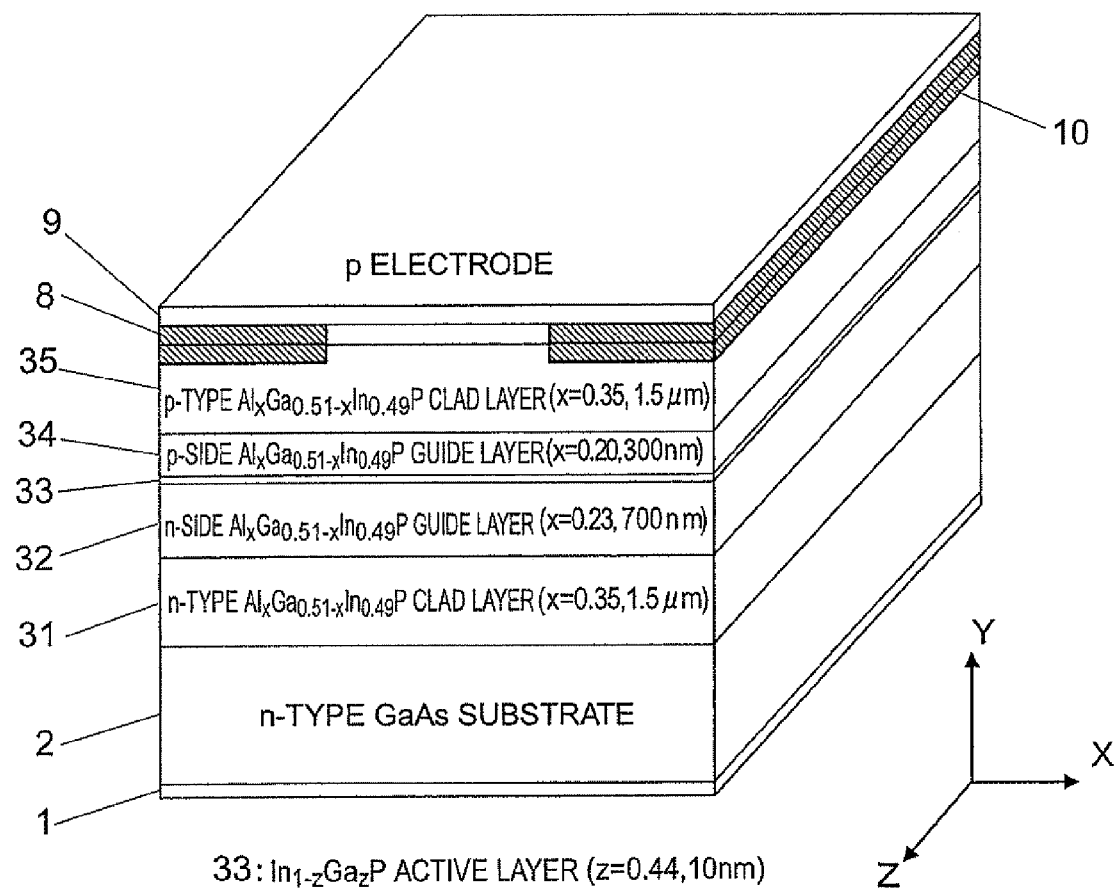
FIG. 8 is a perspective view showing a semiconductor laser apparatus according to a sixth embodiment of the present invention.

Although in the above-mentioned fifth embodiment (FIG. 7), the n-side $In_{1-x}Ga_xAs_yP_{1-y}$ guide layer 27 and the p-side $In_{1-x}Ga_xAs_yP_{1-y}$ guide layer 29 are used as individual guide layers, and the $GaAs_{1-z}P_z$ active layer 28 is used as an active layer, an n-side $Al_xGa_{0.51-x}In_{0.49}P$ guide layer 32, a p-side $Al_xGa_{0.51-x}In_{0.49}P$ guide layer 34 and an $In_{1-z}Ga_zP$ active layer 33 may instead be used, as shown in FIG. 8.

FIG. 8 is a perspective view that shows a sixth embodiment of the present invention, wherein a semiconductor laser apparatus with an oscillation wavelength band of 670 nm for example is illustrated. In FIG. 8, the same or like parts or elements as those described above (see FIG. 7) are identified by the same symbols while omitting a detailed description thereof.

In this case, the semiconductor laser apparatus includes an n-type $Al_xGa_{0.51-x}In_{0.49}P$ clad layer 31, the n-side $Al_xGa_{0.51-x}In_{0.49}P$ guide layer 32, the $In_{1-z}Ga_zP$ active layer 33, the p-side $Al_xGa_{0.51-x}In_{0.49}P$ guide layer 34 and a p-type $Al_xGa_{0.51-x}In_{0.49}P$ clad layer 35, in addition to the above-mentioned individual layers 1, 2, 8 through 10 and as layers different in composition from the above-mentioned individual layers 26 through 30.

The n-type clad layer 31 has an Al composition ratio x of 0.30 and a layer thickness of 1.5 μm. The n-side guide layer 32 has an Al composition ratio x of 0.23 and a layer thickness of 700 nm. The active layer 33 has a Ga composition ratio z of 0.44 and a layer thickness of 10 nm. The p-side guide layer 34 has an Al composition ratio x of 0.20 and a layer thickness of 300 nm. The p-type clad layer 35 has an Al composition ratio x of 0.35 and a layer thickness of 1.5 μm.

In FIG. 8, too, the thickness (=300 nm) of the p-side guide layer (AlGaInP) 34 is set to be thinner than the thickness (=700 nm) of the n-side guide layer (AlGaInP) 32, and hence the center position of the $In_{1-z}Ga_zP$ active layer 33 is shifted to the side of the p-type clad layer 35, so the carriers in the p-side guide layer 34 decrease. As a result, the absorption of a laser beam by the carriers is decreased, and the slope efficiency is improved.

In addition, the refractive index of the p-side $Al_xGa_{0.51-x}In_{0.49}P$ guide layer (x=0.20) 34 is set to a value that is higher than the refractive index of the n-side $Al_xGa_{0.51-x}In_{0.49}P$ guide layer (x=0.23) 32, so the optical intensity distribution becomes asymmetric while being biased to the p-side guide layer 34 as mentioned above (see FIG. 2), and the reduction of an optical confinement rate is not induced. As a result, a semiconductor laser apparatus with high electrical conversion efficiency can be achieved without causing an increase in a threshold current.

As described above, according to the sixth embodiment (FIG. 8) of the present invention, similar to the above-mentioned first through fifth embodiments, the thickness (300 nm) of the p-type clad layer side guide layer 34 is set to be thinner than the thickness (700 nm) of the n-type clad layer side guide layer 34 thereby to make the center position of the $In_{1-z}Ga_zP$ active layer 33 closer to the p-type clad layer 35, and at the same time, the refractive index of the p-side guide layer 34 is set to be higher than the refractive index of the n-side guide layer 32. With this arrangement, the optical absorption of the carriers in the individual guide layers 32, 34 can be decreased while suppressing the reduction of the optical confinement rate of the active layer 33, whereby the electric conversion efficiency of the semiconductor laser apparatus can be raised.

Although a proton injection method similar to the above-mentioned is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 31 through 35 are one example, and the present invention is not limited to this.

Embodiment 7

Figure 9:
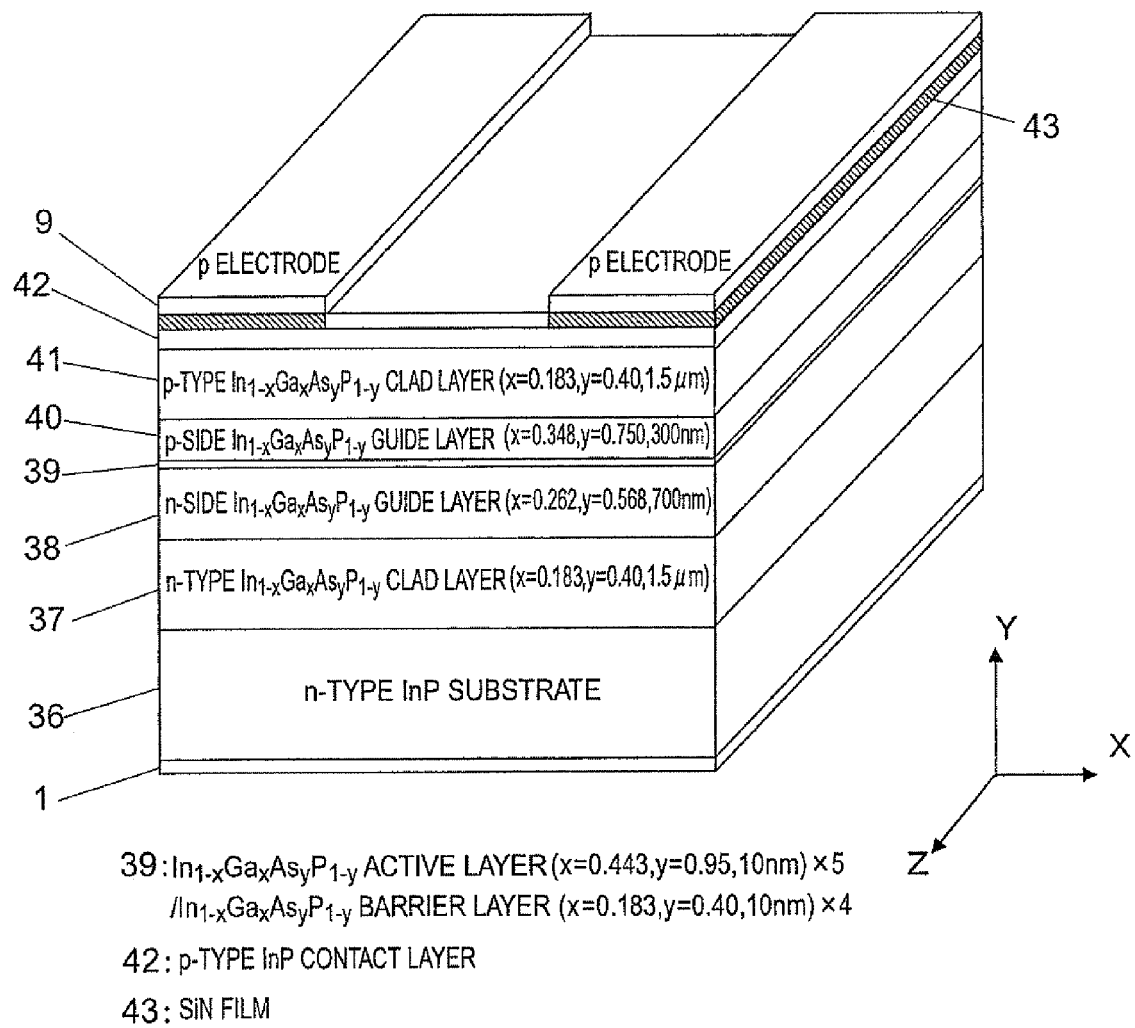
FIG. 9 is a perspective view showing a semiconductor laser apparatus according to a seventh embodiment of the present invention.

Although in the above-mentioned first through sixth embodiments (FIG. 1 and FIG. 4 through FIG. 8), the n-type GaAs substrate 2, the p-type GaAs contact layer 8 and the proton injection region 10 are used as layers that are adjacent to the individual electrodes 1, 9, an n-type InP substrate 36, a p-type InP contact layer 42 and an Si N film 43 may instead be used, as shown in FIG. 9.

FIG. 9 is a perspective view that shows a seventh embodiment of the present invention, wherein a semiconductor laser apparatus with an oscillation wavelength band of 1,300 nm for example is illustrated. In FIG. 9, the same or like parts or elements as those described above (see FIG. 1 and FIG. 4 through FIG. 8) are identified by the same symbols while omitting a detailed description thereof.

In this case, the semiconductor laser apparatus includes, between the above-mentioned n electrode 1 and p electrode 9 in the order from the bottom to the top, the n-type InP substrate 36, an n-type $In_{1-x}Ga_xAs_yP_{1-y}$ clad layer 37, an n-side $In_{1-x}Ga_xAs_yP_{1-y}$ guide layer 38, a quantum well active layer 39, a p-side $In_{1-x}Ga_xAs_yP_{1-y}$ guide layer 40, a p-type $In_{1-x}Ga_xAs_yP_{1-y}$ clad layer 41, the p-type InP contact layer 42 and the SiN film 43.

The n-type clad layer 37 has a Ga composition ratio x of 0.183, an As composition ratio y of 0.40 and a layer thickness of 1.5 μm. The n-side guide layer 38 has a Ga composition ratio x of 0.262, an As composition ratio y of 0.568 and a layer thickness of 700 nm. The p-side guide layer 40 has a Ga composition ratio x of 0.348, an As composition ratio y of 0.750 and a layer thickness of 300 nm. The p-type clad layer 41 has a Ga composition ratio x of 0.183, an Al composition ratio t of 0.40 and a layer thickness of 1.5 μm.

In addition, the quantum well active layer 39 is constructed to have four $In_{1-x}Ga_xAs_yP_{1-y}$ barrier layers inserted between five $In_{1-x}Ga_xAs_yP_{1-y}$ active layers in an interlaced manner.

In the quantum well active layer 39, each of the $In_{1-x}Ga_xAs_yP_{1-y}$ active layers (x5) has a Ga composition ratio x of 0.443, an As composition ratio y of 0.95 and a layer thickness of 10 nm, and each of the $In_{1-x}Ga_xAs_yP_{1-y}$ barrier layers (x4) has a Ga composition ratio x of 0.183, an As composition ratio y of 0.40 and a layer thickness of 10 nm.

In FIG. 9, too, the thickness (=300 nm) of the p-side guide layer (InGaAsP) 40 is set to be thinner than the thickness (=700 nm) of the n-side guide layer (InGaAsP) 38, and hence the center position of the quantum well active layer 39 is shifted to the side of the p-type clad layer 41, so the carriers in the p-side guide layer 40 decrease. As a result, the absorption of a laser beam by the carriers is decreased, and the slope efficiency is improved.

In addition, the refractive index of the p-side $In_{1-x}Ga_xAs_yP_{1-y}$ guide layer (x=0.348, y=0.750) 40 is set to a value that is higher than the refractive index of the n-side $In_{1-x}Ga_xAs_yP_{1-y}$ guide layer (x=0.262, y=0.568) 38, so the optical intensity distribution becomes asymmetric while being biased to the p-side guide layer 40 as mentioned above (see FIG. 2), and the reduction of an optical confinement rate is not induced. As a result, a semiconductor laser apparatus with high electrical conversion efficiency can be achieved without causing an increase in a threshold current.

As described above, according to the seventh embodiment (FIG. 9) of the present invention, similar to the above-mentioned first through sixth embodiments, the thickness (300 nm) of the p-type clad layer side guide layer 40 is set to be thinner than the thickness (700 nm) of the n-type clad layer side guide layer 38 thereby to make the center position of the quantum well active layer 39 closer to the p-type clad layer 41, and at the same time, the refractive index of the p-side guide layer 40 is set to be higher than the refractive index of the n-side guide layer 38. With this arrangement, the optical absorption of the carriers in the individual guide layers 38, 40 can be decreased while suppressing the reduction of the optical confinement rate of the quantum well active layer 39, whereby the electric conversion efficiency of the semiconductor laser apparatus can be raised.

Although a method according to the SiN film 43 is shown as a current constriction method for raising oscillation efficiency, it is needless to say that the present invention is not limited to such a method, but there can be applied an ion injection method such as a proton injection method similar to the above-mentioned first through sixth embodiments, a method using a waveguide such as ridge formation, or a method of inserting current block layers such as embedding n-InP semiconductor layers, p-InP semiconductor layers, etc., in a multiple-layered manner.

In addition, the thickness and composition of the above-mentioned individual layers 37 through 41 are one example, and the present invention is not limited to this.

Embodiment 8

Figure 10:
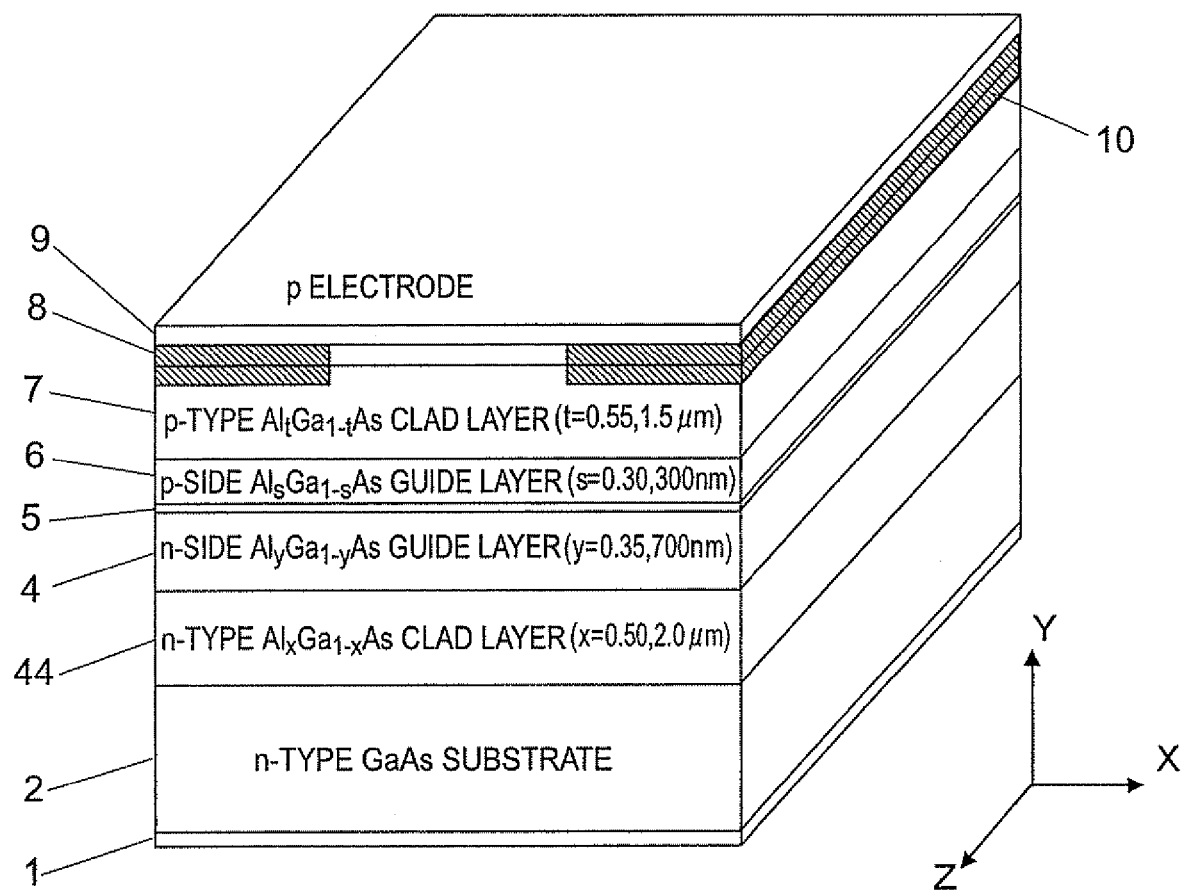
FIG. 10 is a perspective view showing a semiconductor laser apparatus according to an eighth embodiment of the present invention.

Although in the above-mentioned first through seventh embodiments (FIG. 1 and FIG. 4 through FIG. 9), no particular consideration is given to the refractive index of an n-type clad layer, an n-type $Al_xGa_{1-x}As$ clad layer (Al composition ratio x=0.50, and layer thickness=2.0 µm) 44 may be used as an n-type clad layer, as shown in FIG. 10, and the refractive index of the n-type clad layer 44 may be set to a value that is higher than the refractive index of a p-type $Al_tGa_{1-t}As$ clad layer 7.

FIG. 10 is a perspective view that shows an eighth embodiment of the present invention, wherein a semiconductor laser apparatus with an oscillation wavelength band of 810 nm for example is illustrated. In FIG. 10, the same or like parts or elements as those described above (see FIG. 1) are identified by the same symbols while omitting a detailed description thereof.

In this case, the semiconductor laser apparatus includes, in place of the n-type clad layer 3 among the above-mentioned individual layers 1 through 10, an n-type $Al_xGa_{1-x}As$ clad layer (Al composition ratio x=0.50 and layer thickness=2.0 µm) 44.

In the semiconductor laser apparatus of FIG. 10, electrons are injected from the n-type $Al_xGa_{1-x}As$ clad layer 44 into the $Al_zGa_{1-z}As$ active layer 5 in a vertical direction with respect thereto through the n-side $Al_yGa_{1-y}As$ guide layer 4 while applying a forward bias thereto. In addition, when holes (positive holes) are injected from the p-type $Al_tGa_{1-t}As$ clad layer 7 into the $Al_zGa_{1-z}As$ active layer 5 in a vertical direction with respect thereto through the p-side $Al_sGa_{1-s}As$ guide layer 6, a laser beam is emitted in Z-axis directions, i.e., in two (positive and negative) directions.

Figure 11:
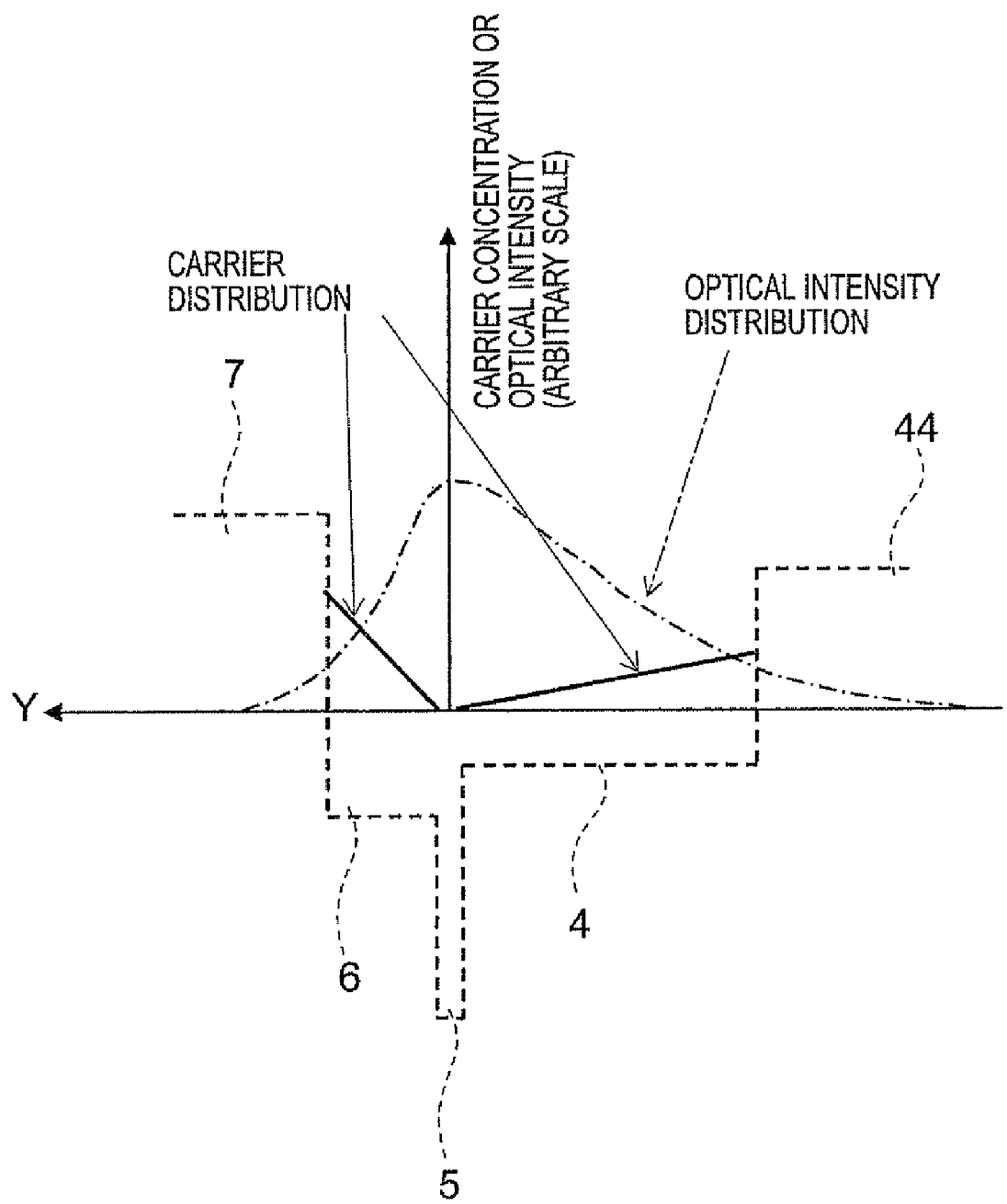
FIG. 11 is an explanatory view showing a carrier distribution and an optical intensity distribution in the semiconductor laser apparatus according to the eighth embodiment of the present invention.

FIG. 11 is an explanatory view that diagrammatically shows the optical intensity distribution (see an alternate long and short dash line) of the semiconductor laser apparatus of FIG. 10, wherein the optical intensity distribution of a near field pattern (NFP) decided by the distribution (see a thick solid line) of carriers (electrons and holes) and the refractive distribution in each of the n-side $Al_yGa_{1-y}As$ guide layer 4 and the p-side $Al_sGa_{1-s}As$ guide layer 6 is illustrated.

In FIG. 11, a broken line indicates the band structure of conduction bands (the individual clad layers 44, 7, the individual guide layers 4, 6, and the active layer 5), and a thick solid line indicates the carrier concentration of the electrons and holes, and an alternate long and short dash line indicates the optical intensity distribution.

As shown in FIG. 11, with respect to the carrier distribution (thick solid line) in the individual guide layers 4, 6, operational effects similar to those in the above-mentioned first embodiment are obtained.

In addition, with respect to the optical intensity distribution (alternate long and short dash line), the refractive index of the p-side $Al_sGa_{1-s}As$ guide layer (Al composition ratio s=030) 6 is set to a value that is higher than the refractive index of the n-side $Al_yGa_{1-y}As$ guide layer (Al composition ratio y=0.35) 4, so the optical intensity distribution becomes asymmetric while being biased to the p-side guide layer 6, and the reduction of an optical confinement rate is not induced, thus making it possible to prevent an increase in a threshold current.

Further, with respect to the optical intensity distribution, the refractive index of the n-type $Al_xGa_{1-x}As$ clad layer (Al composition ratio x=0.50) 44 is set to a value that is higher than the refractive index of the p-type $Al_tGa_{1-t}As$ clad layer (Al composition ratio t=0.55) 7, so the optical intensity in the clad layers is distributed to be greater in the n-type clad layer 44 than in the p-type clad layer 7.

In general, the mobility of electrons is higher than that of holes, and hence the carrier concentration of the n-type clad layer 44 is set to a value that is substantially smaller than the carrier concentration of the p-type clad layer 7. As a result, the optical intensity, being greater in the n-type clad layer 44 than in the p-type clad layer 7, means that the carrier absorption in the clad layers is reduced.

Accordingly, the slope efficiency is enhanced, and a semiconductor laser apparatus with high electrical conversion efficiency can be achieved without causing an increase in a threshold current.

As described above, according to the eighth embodiment of the present invention, the center position of the active layer 5 is made closer to the side of the p-type clad layer 7, and at the same time the refractive index of the p-type clad layer side guide layer 6 is set to a higher value, similarly as stated above, so the optical absorption in the individual guide layers 4, 6 can be decreased while suppressing the reduction of the optical confinement rate of the active layer 5, whereby the electric conversion efficiency of the semiconductor laser apparatus can be raised.

Moreover, the refractive index of the n-type clad layer 44 is set to a value that is higher than the refractive index of the p-type clad layer 7, so the optical absorption in the p-type clad layer 7 can be reduced. Accordingly, the electric conversion efficiency of the semiconductor laser apparatus can be further enhanced.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 44, 4 through 7 are one example, and the present invention is not limited to this.

Embodiment 9

Figure 12:
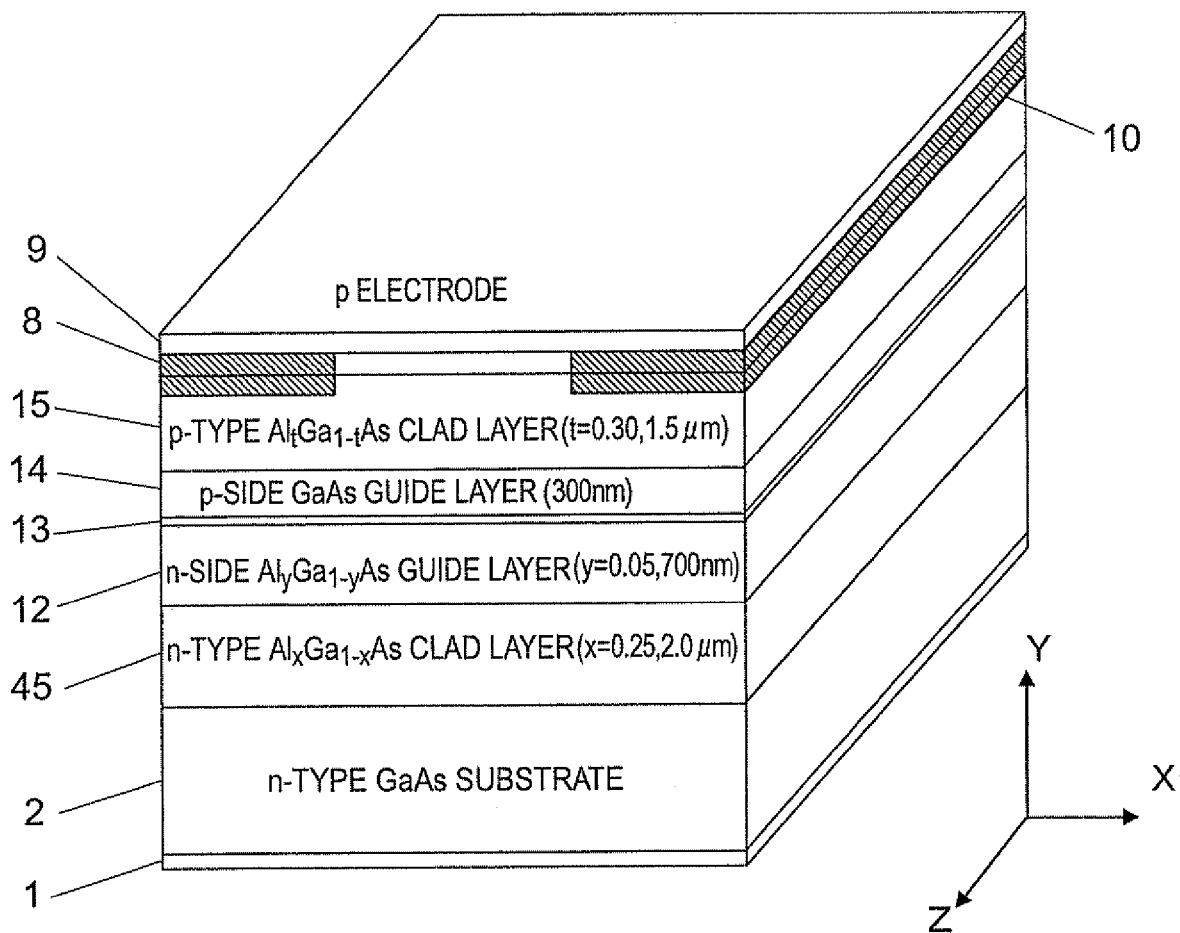
FIG. 12 is a perspective view showing a semiconductor laser apparatus according to a ninth embodiment of the present invention.

Although in the above-mentioned eighth embodiment (FIG. 10), there is shown the case where the n-type clad layer 44 is applied to the construction of the above-mentioned first embodiment (FIG. 1), an n-type $Al_xGa_{1-x}As$ clad layer (Al composition ratio x=0.25, and layer thickness=2.0 µm) 45 may be applied to the construction of the above-mentioned second embodiment (FIG. 4), as shown in FIG. 12.

FIG. 12 is a perspective view that shows a ninth embodiment of the present invention, wherein a semiconductor laser apparatus with an oscillation wavelength band of 980 nm for example is illustrated. In FIG. 12, the same or like parts or elements as those described above (see FIG. 4) are identified by the same symbols while omitting a detailed description thereof.

In this case, the semiconductor laser apparatus includes, in place of the n-type clad layer 11 among the above-mentioned individual layers 1, 2, 8 through 15, an n-type $Al_xGa_{1-x}As$ clad layer (Al composition ratio x=0.25, and layer thickness=2.0 µm) 45.

According to the semiconductor laser apparatus shown in FIG. 12, with respect to the carrier distribution in the individual guide layers 12, 14, operational effects similar to those in the above-mentioned second embodiment are obtained.

In addition, with respect to the optical intensity distribution, the refractive index of the p-side GaAs guide layer 14 is set to a value that is higher than the refractive index of the n-side $Al_yGa_{1-y}As$ guide layer (Al composition ratio y=0.05) 12, so the optical intensity distribution becomes asymmetric while being biased to the p-side guide layer 12, and the reduction of an optical confinement rate is not induced, thus making it possible to prevent an increase in a threshold current.

Further, with respect to the optical intensity distribution, the refractive index of the n-type $Al_xGa_{1-x}As$ clad layer (Al composition ratio x=0.25) 45 is set to a value that is higher than the refractive index of the p-type $Al_tGa_{1-t}As$ clad layer (Al composition ratio t=0.55) 15, so the optical intensity in the clad layers is distributed to be greater in the n-type clad layer 45 than in the p-type clad layer 15.

Moreover, a lot of light is distributed in the n-type clad layer 45 of a low carrier concentration, so the carrier absorption in the clad layers is reduced. Accordingly, the slope efficiency is enhanced, and a semiconductor laser apparatus with high electrical conversion efficiency can be achieved without causing an increase in a threshold current.

As described above, according to the ninth embodiment (FIG. 12) of the present invention, the center position of the active layer 13 is made closer to the side of the p-type clad layer 15, and at the same time the refractive index of the p-type clad layer side guide layer 14 is set to a higher value, similarly as stated above, so the optical absorption in the individual guide layers 12, 14 can be decreased while suppressing the reduction of the optical confinement rate of the active layer 13, whereby the electric conversion efficiency of the semiconductor laser apparatus can be raised.

Also, the refractive index of the n-type clad layer 45 is set to a value that is higher than the refractive index of the p-type clad layer 15, so the optical absorption in the p-type clad layer 15 can be reduced. Accordingly, the electric conversion efficiency of the semiconductor laser apparatus can be further enhanced.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 45, 12 through 15 are one example, and the present invention is not limited to this.

Embodiment 10

Figure 13:
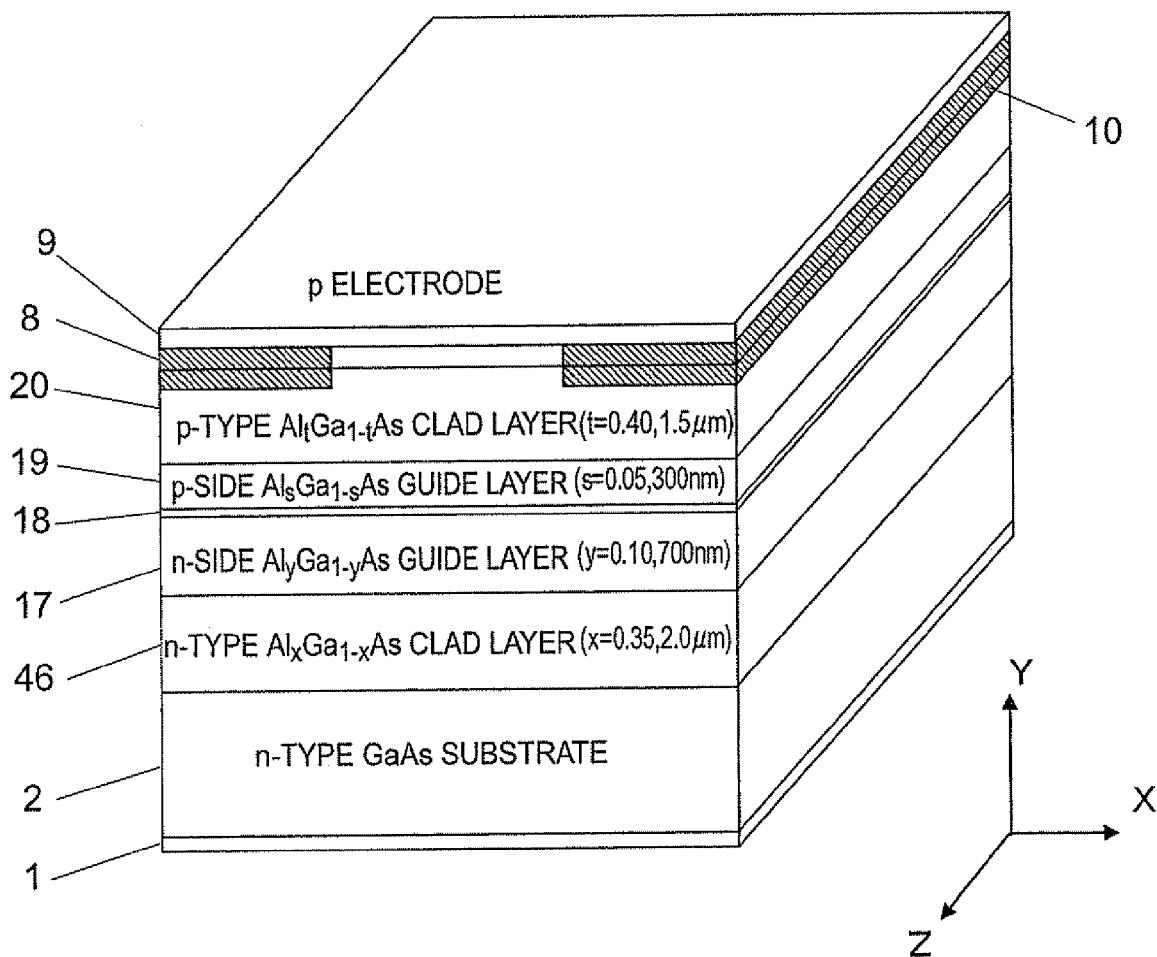
FIG. 13 is a perspective view showing a semiconductor laser apparatus according to a tenth embodiment of the present invention.

Although in the above-mentioned ninth embodiment (FIG. 12), there is shown the case where the n-type clad layer 45 is applied to the construction of the above-mentioned second embodiment (FIG. 4), an n-type $Al_xGa_{1-x}As$ clad layer (Al composition ratio x=0.35, and layer thickness=2.0 μm) 46 may be applied to the construction of the above-mentioned third embodiment (FIG. 5), as shown in FIG. 13.

FIG. 13 is a perspective view that shows a tenth embodiment of the present invention, wherein a semiconductor laser apparatus with an oscillation wavelength band of 940 nm for example is illustrated. In FIG. 13, the same or like parts or elements as those described above (see FIG. 5) are identified by the same symbols while omitting a detailed description thereof.

In this case, the semiconductor laser apparatus includes, in place of the n-type clad layer 16 among the above-mentioned individual layers 1, 2, 8 through 10, 16 through 20, an n-type $Al_xGa_{1-x}As$ clad layer (Al composition ratio x=0.35, and layer thickness=2.0 μm) 46.

According to the semiconductor laser apparatus shown in FIG. 13, with respect to the carrier distribution in the individual guide layers 17, 19, operational effects similar to those in the above-mentioned third embodiment are obtained.

In addition, with respect to the optical intensity distribution, the refractive index of the p-side $Al_sGa_{1-s}As$ guide layer (s=0.05) 19 is set to a value that is higher than the refractive index of the n-side $Al_yGa_{1-y}As$ guide layer (y=0.10) 17, so the optical intensity distribution becomes asymmetric while being biased to the p-side guide layer 19, and the reduction of an optical confinement rate is not induced, thereby making it possible to prevent an increase in a threshold current.

Further, with respect to the optical intensity distribution, the refractive index of the n-type $Al_xGa_{1-x}As$ clad layer (Al composition ratio x=0.35) 46 is set to a value that is higher than the refractive index of the p-type $Al_tGa_{1-t}As$ clad layer (Al composition ratio t=0.40) 20, so the optical intensity in the clad layers is distributed to be greater in the n-type clad layer 46 than in the p-type clad layer 20.

Moreover, a lot of light is distributed in the n-type clad layer 46 of a low carrier concentration, so the carrier absorption in the clad layers is reduced. Accordingly, the slope efficiency is enhanced, and a semiconductor laser apparatus with high electrical conversion efficiency can be achieved without causing an increase in a threshold current.

As described above, according to the tenth embodiment (FIG. 13) of the present invention, the center position of the active layer 18 is made closer to the side of the p-type clad layer 20, and at the same time the refractive index of the p-type clad layer side guide layer 19 is set to a higher value, similarly as stated above, so the optical absorption in the individual guide layers 17, 19 can be decreased while suppressing the reduction of the optical confinement rate of the active layer 18, whereby the electric conversion efficiency of the semiconductor laser apparatus can be raised.

Also, the refractive index of the n-type clad layer 46 is set to a value that is higher than the refractive index of the p-type clad layer 20, so the optical absorption in the p-type clad layer 20 can be reduced. Accordingly, the electric conversion efficiency of the semiconductor laser apparatus can be further enhanced.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 46, 17 through 20 are one example, and the present invention is not limited to this.

Embodiment 11

Figure 14:
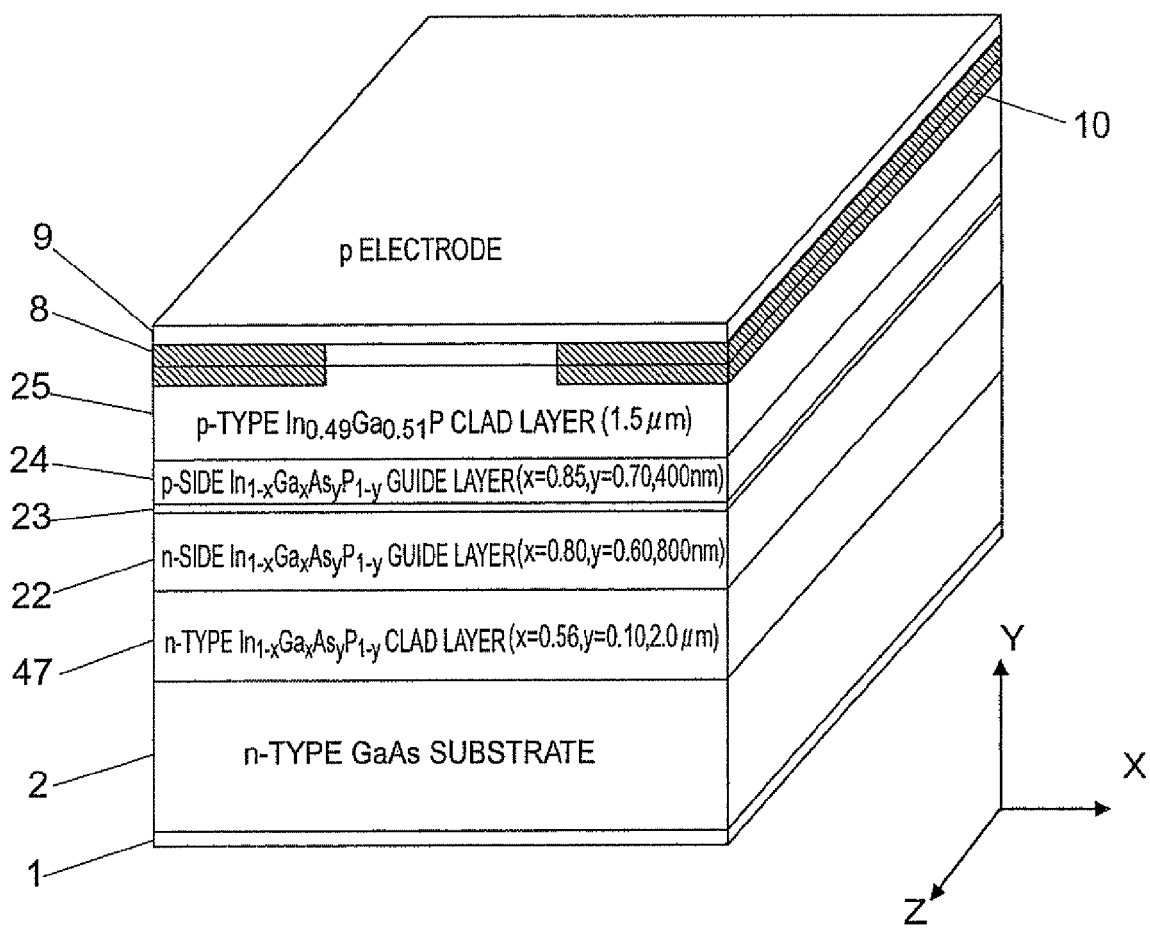
FIG. 14 is a perspective view showing a semiconductor laser apparatus according to an eleventh embodiment of the present invention.

Although in the above-mentioned tenth embodiment (FIG. 13), there is shown the case where the n-type clad layer 46 is applied to the construction of the above-mentioned third embodiment (FIG. 5), an n-type $In_{1-x}Ga_xAs_yP_{1-y}$ clad layer (Ga composition ratio x=0.56, As composition ratio y=0.10, and layer thickness=2.0 μm) 47 may be applied to the construction of the above-mentioned fourth embodiment (FIG. 6), as shown in FIG. 14.

FIG. 14 is a perspective view that shows an eleventh embodiment of the present invention, wherein a semiconductor laser apparatus with an oscillation wavelength band of 940 nm for example is illustrated. In FIG. 14, the same or like parts or elements as those described above (see FIG. 6) are identified by the same symbols while omitting a detailed description thereof.

In this case, the semiconductor laser apparatus includes, in place of the n-type clad layer 21 among the above-mentioned individual layers 1, 2, 8 through 10, 21 through 25, an n-type $In_{1-x}Ga_xAs_yP_{1-y}$ clad layer (Ga composition ratio x=0.56, As composition ratio x=0.10, and layer thickness=2.0 μm) 47.

According to the semiconductor laser apparatus shown in FIG. 14, with respect to the carrier distribution in the individual guide layers 22, 24, operational effects similar to those in the above-mentioned fourth embodiment are obtained.

In addition, with respect to the optical intensity distribution, the refractive index of the p-side $In_{1-x}Ga_xAs_yP_{1-y}$ guide layer (x=0.85, y=0.70) 24 is set to a value that is higher than the refractive index of the n-side $In_{1-x}Ga_xAs_yP_{1-y}$ guide layer (x=0.80, y=0.60) 22, so the optical intensity distribution becomes asymmetric while being biased to the p-side guide layer 24, and the reduction of an optical confinement rate is not induced, thus making it possible to prevent an increase in a threshold current.

Further, with respect to the optical intensity distribution, the refractive index of the n-type $In_{1-x}Ga_xAs_yP_{1-y}$ clad layer (Ga composition ratio x=0.56, and As composition ratio y=0.10) 47 is set to a value that is higher than the refractive index of the p-type $In_{0.49}Ga_{0.51}P$ clad layer 25, so the optical intensity in the clad layers is distributed to be greater in the n-type clad layer 47 than in the p-type clad layer 25.

Moreover, a lot of light is distributed in the n-type clad layer 47 of a low carrier concentration, so the carrier absorption in the clad layers is reduced. Accordingly, the slope efficiency is enhanced, and a semiconductor laser apparatus with high electrical conversion efficiency can be achieved without causing an increase in a threshold current.

As described above, according to the eleventh embodiment (FIG. 14) of the present invention, the center position of the active layer 23 is made closer to the side of the p-type clad layer 25, and at the same time the refractive index of the p-type clad layer side guide layer 24 is set to a higher value, similarly as stated above, so the optical absorption in the individual guide layers 22, 24 can be decreased while suppressing the reduction of the optical confinement rate of the active layer 23, whereby the electric conversion efficiency of the semiconductor laser apparatus can be raised.

Also, the refractive index of the n-type clad layer 47 is set to a value that is higher than the refractive index of the p-type clad layer 25, so the optical absorption in the p-type clad layer 25 can be reduced. Accordingly the electric conversion efficiency of the semiconductor laser apparatus can be further enhanced.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 47, 22 through 25 are one example, and the present invention is not limited to this.

Embodiment 12

Figure 15:
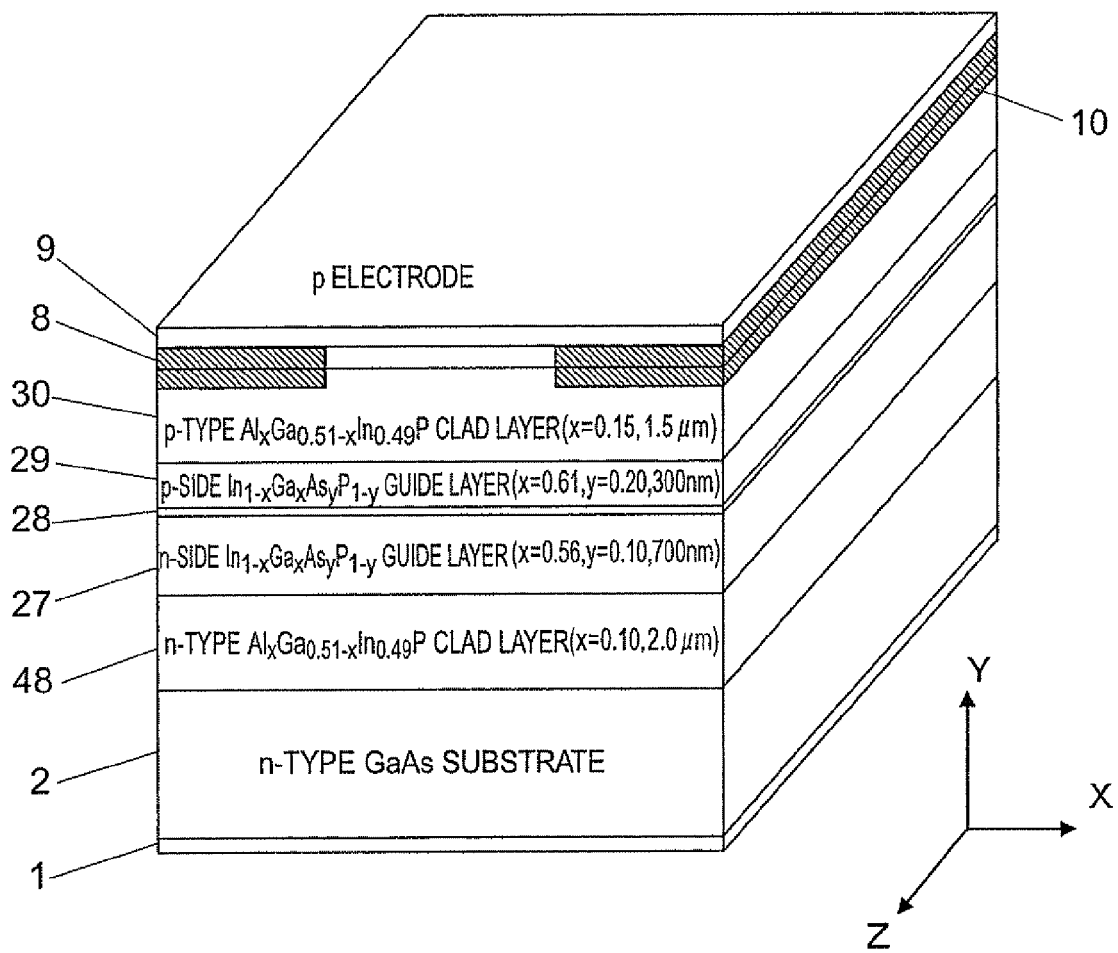
FIG. 15 is a perspective view showing a semiconductor laser apparatus according to a twelfth embodiment of the present invention.

Although in the above-mentioned eleventh embodiment (FIG. 14), there is shown the case where the n-type clad layer 47 is applied to the construction of the above-mentioned fourth embodiment (FIG. 6), an n-type $Al_xGa_{0.51-x}In_{0.49}P$ clad layer (Al composition ratio x=0.10, and layer thickness=2.0 μm) 48 may be applied to the construction of the above-mentioned fifth embodiment (FIG. 7), as shown in FIG. 15.

FIG. 15 is a perspective view that shows a twelfth embodiment of the present invention, wherein a semiconductor laser apparatus with an oscillation wavelength band of 810 nm for example is illustrated. In FIG. 15, the same or like parts or elements as those described above (see FIG. 7) are identified by the same symbols while omitting a detailed description thereof.

In this case, the semiconductor laser apparatus includes, in place of the n-type clad layer 26 among the above-mentioned individual layers 1, 2, 8 through 10, 26 through 30, an n-type $Al_xGa_{0.51-x}In_{0.49}P$ clad layer (As composition ratio x=0.10, and layer thickness=2.0 μm) 48.

According to the semiconductor laser apparatus shown in FIG. 15, with respect to the carrier distribution in the individual guide layers 22, 24, operational effects similar to those in the above-mentioned fifth embodiment are obtained.

In addition, with respect to the optical intensity distribution, the refractive index of the p-side $In_{1-x}Ga_xAs_yP_{1-y}$ guide layer (x=0.61, y=0.20) 29 is set to a value that is higher than the refractive index of the n-side $In_{1-x}Ga_xAs_yP_{1-y}$ guide layer (x=0.56, y=0.10) 27, so the optical intensity distribution becomes asymmetric while being biased to the p-side guide layer 29, and the reduction of an optical confinement rate is not induced, thus making it possible to prevent an increase in a threshold current.

Further, with respect to the optical intensity distribution, the refractive index of the n-type $Al_xGa_{0.51-x}In_{0.49}P$ clad layer (x=0.10) 48 is set to a value that is higher than the refractive index of the p-type $Al_xGa_{0.51-x}In_{0.49}P$ clad layer (x=0.15) 30, so the optical intensity in the clad layers is distributed to be greater in the n-type clad layer 48 than in the p-type clad layer 30.

Moreover, a lot of light is distributed in the n-type clad layer 48 of a low carrier concentration, so the carrier absorption in the clad layers is reduced. Accordingly, the slope efficiency is enhanced, and a semiconductor laser apparatus with high electrical conversion efficiency can be achieved without causing an increase in a threshold current.

As described above, according to the twelfth embodiment (FIG. 15) of the present invention, the center position of the active layer 28 is made closer to the side of the p-type clad layer 30, and at the same time the refractive index of the p-type clad layer side guide layer 29 is set to a higher value, similarly as stated above, so the optical absorption in the individual guide layers 27, 29 can be decreased while suppressing the reduction of the optical confinement rate of the active layer 28, whereby the electric conversion efficiency of the semiconductor laser apparatus can be raised.

Also, the refractive index of the n-type clad layer 48 is set to a value that is higher than the refractive index of the p-type clad layer 30, so the optical absorption in the p-type clad layer 30 can be reduced. Accordingly, the electric conversion efficiency of the semiconductor laser apparatus can be further enhanced.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 48, 27 through 30 are one example, and the present invention is not limited to this.

Embodiment 13

Figure 16:
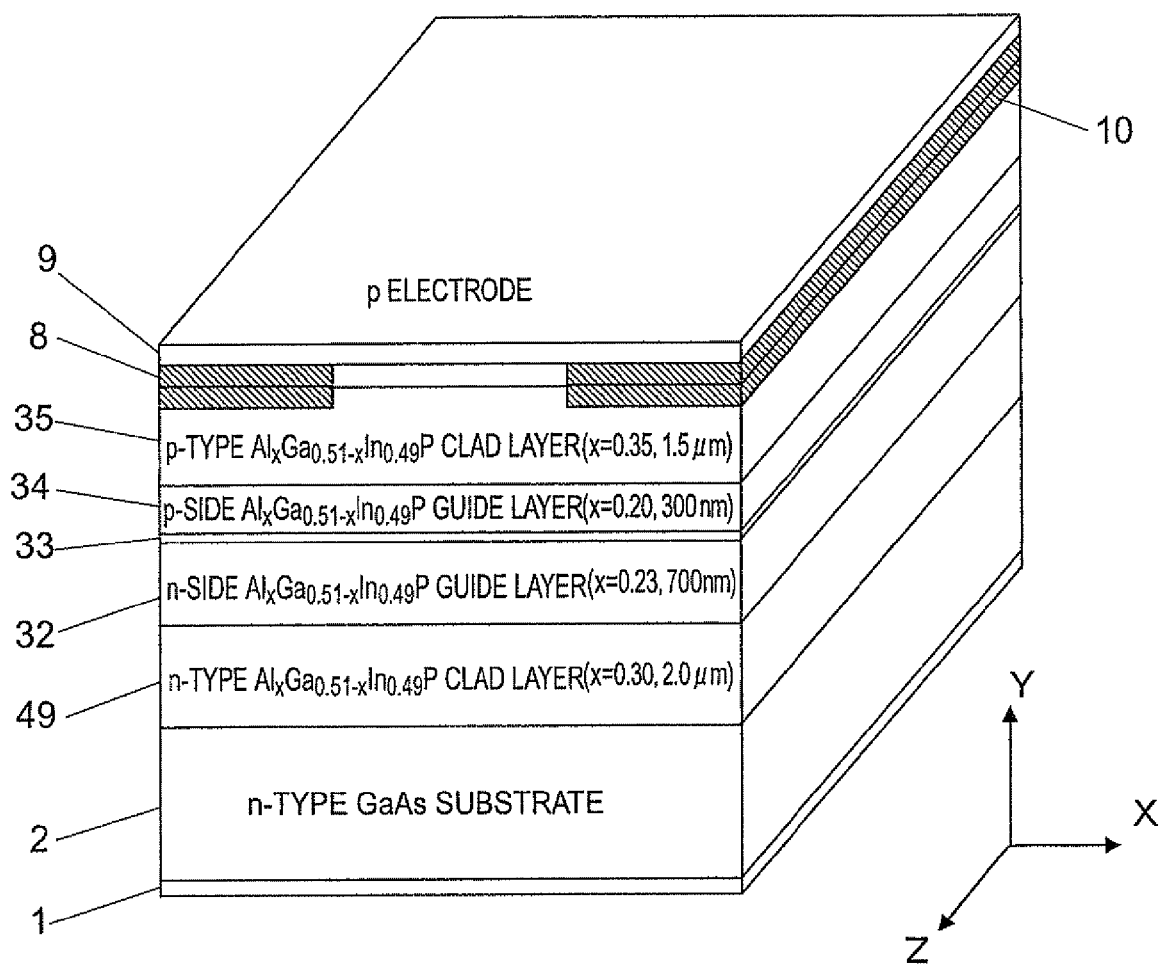
FIG. 16 is a perspective view showing a semiconductor laser apparatus according to a thirteenth embodiment of the present invention.

Although in the above-mentioned twelfth embodiment (FIG. 15), there is shown the case where the n-type clad layer 48 is applied to the construction of the above-mentioned fifth embodiment (FIG. 7), an n-type $Al_xGa_{0.51-x}In_{0.49}P$ clad layer (Al composition ratio x=0.30, and layer thickness=2.0 μm) 49 may be applied to the construction of the above-mentioned sixth embodiment (FIG. 8), as shown in FIG. 16.

FIG. 16 is a perspective view that shows a thirteenth embodiment of the present invention, wherein a semiconductor laser apparatus with an oscillation wavelength band of 670 nm for example is illustrated. In FIG. 16, the same or like parts or elements as those described above (see FIG. 8) are identified by the same symbols while omitting a detailed description thereof.

In this case, the semiconductor laser apparatus includes, in place of the n-type clad layer 31 among the above-mentioned individual layers 1, 2, 8 through 10, 31 through 35, an n-type $Al_xGa_{0.51-x}In_{0.49}P$ clad layer (Al composition ratio x=0.30, and layer thickness=2.0 μm) 49.

According to the semiconductor laser apparatus shown in FIG. 16, with respect to the carrier distribution in the individual guide layers 32, 34, operational effects similar to those in the above-mentioned sixth embodiment are obtained.

In addition, with respect to the optical intensity distribution, the refractive index of the p-side $Al_xGa_{0.51-x}In_{0.49}P$ guide layer (x=0.20) 34 is set to a value that is higher than the refractive index of the n-side $Al_xGa_{0.51-x}In_{0.49}P$ guide layer (x=0.23) 32, so the optical intensity distribution becomes asymmetric while being biased to the p-side guide layer 34, and the reduction of an optical confinement rate is not induced, thus making it possible to prevent an increase in a threshold current.

Further, with respect to the optical intensity distribution, the n-type $Al_xGa_{0.51-x}In_{0.49}P$ clad layer (x=0.30) 49 is set to a value that is higher than the refractive index of the p-type $Al_xGa_{0.51-x}In_{0.49}P$ clad layer (x=0.35) 35, so the optical intensity in the clad layers is distributed to be greater in the n-type clad layer 49 than in the p-type clad layer 35.

Moreover, a lot of light is distributed in the n-type clad layer 49 of a low carrier concentration, so the carrier absorption in the clad layers is reduced. Accordingly, the slope efficiency is enhanced, and a semiconductor laser apparatus with high electrical conversion efficiency can be achieved without causing an increase in a threshold current.

As described above, according to the thirteenth embodiment (FIG. 16) of the present invention, the center position of the active layer 33 is made closer to the side of the p-type clad layer 35, and at the same time the refractive index of the p-type clad layer side guide layer 34 is set to a higher value, similarly as stated above, so the optical absorption in the individual guide layers 32, 34 can be decreased while suppressing the reduction of the optical confinement rate of the active layer 33, whereby the electric conversion efficiency of the semiconductor laser apparatus can be raised.

Also, the refractive index of the n-type clad layer 49 is set to a value that is higher than the refractive index of the p-type clad layer 35, so the optical absorption in the p-type clad layer 35 can be reduced. Accordingly, the electric conversion efficiency of the semiconductor laser apparatus can be further enhanced.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 49, 32 through 35 are one example, and the present invention is not limited to this.

Embodiment 14

Figure 17:
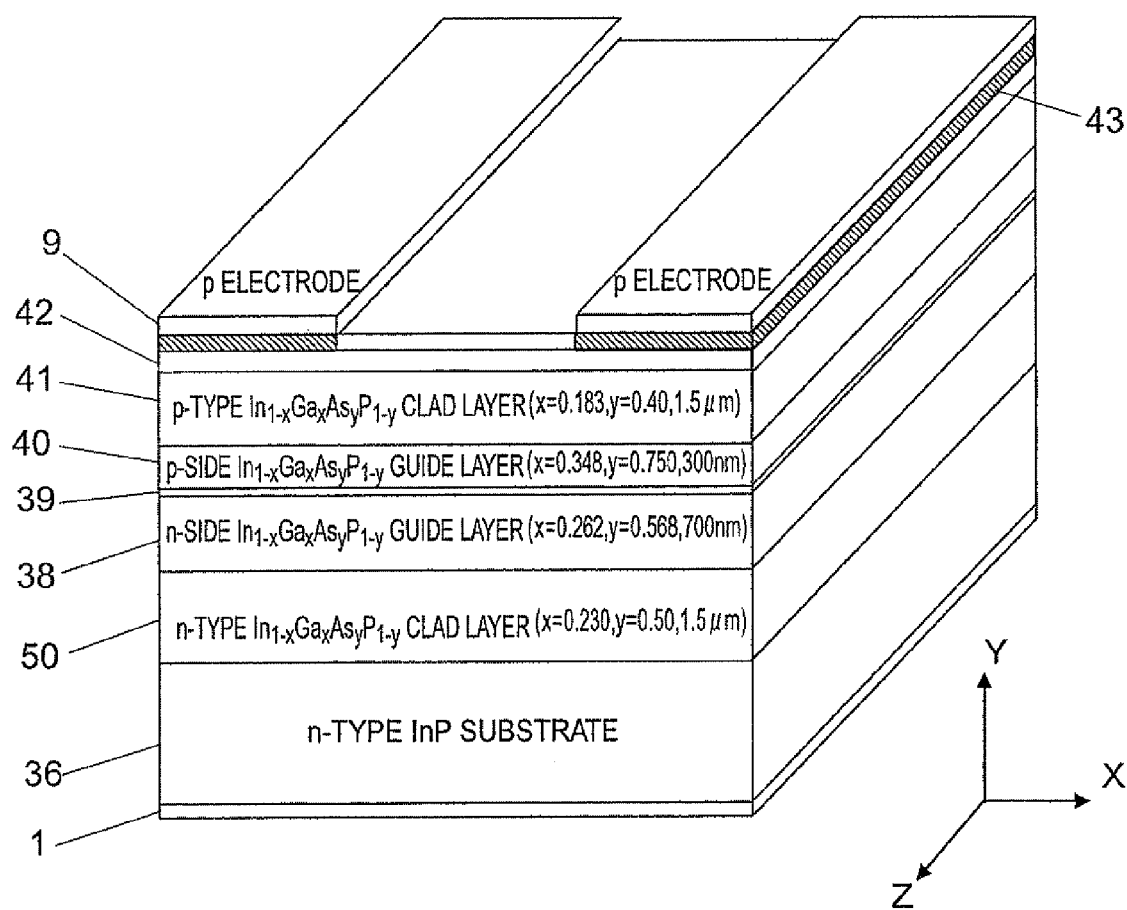
FIG. 17 is a perspective view showing a semiconductor laser apparatus according to a fourteenth embodiment of the present invention.

Although in the above-mentioned thirteenth embodiment (FIG. 16), there is shown the case where the n-type clad layer 49 is applied to the construction of the above-mentioned sixth embodiment (FIG. 8), an n-type $In_{1-x}Ga_xAs_yP_{1-y}$ clad layer (Ga composition ratio x=0.230, As composition ratio y=0.50, and layer thickness=1.5 μm) 50 may be applied to the construction of the above-mentioned seventh embodiment (FIG. 9), as shown in FIG. 17.

FIG. 17 is a perspective view that shows a fourteenth embodiment of the present invention, wherein a semiconductor laser apparatus with an oscillation wavelength band of 1,300 nm for example is illustrated. In FIG. 7, the same or like parts or elements as those described above (see FIG. 9) are identified by the same symbols while omitting a detailed description thereof.

In this case, the semiconductor laser apparatus includes, in place of the n-type clad layer 37 among the above-mentioned individual layers 1, 9, 36 through 437 the n-type $In_{1-x}Ga_xAs_yP_{1-y}$ clad layer (Ga composition ratio x=0.230, As composition ratio y=0.50, and layer thickness=1.5 μm) 50.

According to the semiconductor laser apparatus shown in FIG. 17, with respect to the carrier distribution in the individual guide layers 38, 40, operational effects similar to those in the above-mentioned seventh embodiment are obtained.

In addition, with respect to the optical intensity distribution, the refractive index of the p-side $In_{1-x}Ga_xAs_yP_{1-y}$ guide layer (x=0.348, y=0.750) 40 is set to a value that is higher than the refractive index of the n-side $In_{1-x}Ga_xAs_yP_{1-y}$ guide layer (x=0.262, y=0.568) 38, so the optical intensity distribution becomes asymmetric while being biased to the p-side guide layer 40, and the reduction of an optical confinement rate is not induced, thus making it possible to prevent an increase in a threshold current.

Further, with respect to the optical intensity distribution, the refractive index of the n-type $In_{1-x}Ga_xAs_yP_{1-y}$ clad layer (Ga composition ratio x=0.230, and As composition ratio y=0.50) 50 is set to a value that is higher than the refractive index of the p-type $In_{1-x}Ga_xAs_yP_{1-y}$ clad layer (Ga composition ratio x=0.183, and As composition ratio y=0.40) 41, so the optical intensity in the clad layers is distributed to be greater in the n-type clad layer 50 than in the p-type clad layer 41.

Moreover, a lot of light is distributed in the n-type clad layer 50 of a low carrier concentration, so the carrier absorption in the clad layers is reduced. Accordingly, the slope efficiency is enhanced, and a semiconductor laser apparatus with high electrical conversion efficiency can be achieved without causing an increase in a threshold current.

As described above, according to the fourteenth embodiment (FIG. 17) of the present invention, the center position of the quantum well active layer 39 is made closer to the side of the p-type clad layer 41, and at the same time the refractive index of the p-type clad layer side guide layer 40 is set to a higher value, similarly as stated above, so the optical absorption in the individual guide layers 38, 40 can be decreased while suppressing the reduction of the optical confinement rate of the quantum well active layer 39, whereby the electric conversion efficiency of the semiconductor laser apparatus can be raised.

Also, the refractive index of the n-type clad layer 50 is set to a value that is higher than the refractive index of the p-type clad layer 41, so the optical absorption in the p-type clad layer 41 can be reduced. Accordingly, the electric conversion efficiency of the semiconductor laser apparatus can be further enhanced.

Although a method according to the SiN film 43 is shown as a current constriction method for raising oscillation efficiency, it is needless to say that the present invention is not limited to such a method, but there can be applied an ion injection method such as a proton injection method, a method using a waveguide such as ridge formation, or a method of inserting current block layers such as embedding n-InP semiconductor layers, p-InP semiconductor layers, etc., in a multiple-layered manner.

In addition, the thickness and composition of the above-mentioned individual layers 50, 37 through 41 are one example, and the present invention is not limited to this.

Embodiment 15

Although in the above-mentioned first through fourteenth embodiments, the n-type clad layer side guide layer and the p-type clad layer side guide layer are each composed of a single layer, they may be composed of a plurality of layers (two or more layers), i.e., InGaAsP guide layers 52, 53, 55, 56 with different As composition ratios, respectively, as shown in FIG. 15.

Figure 18:
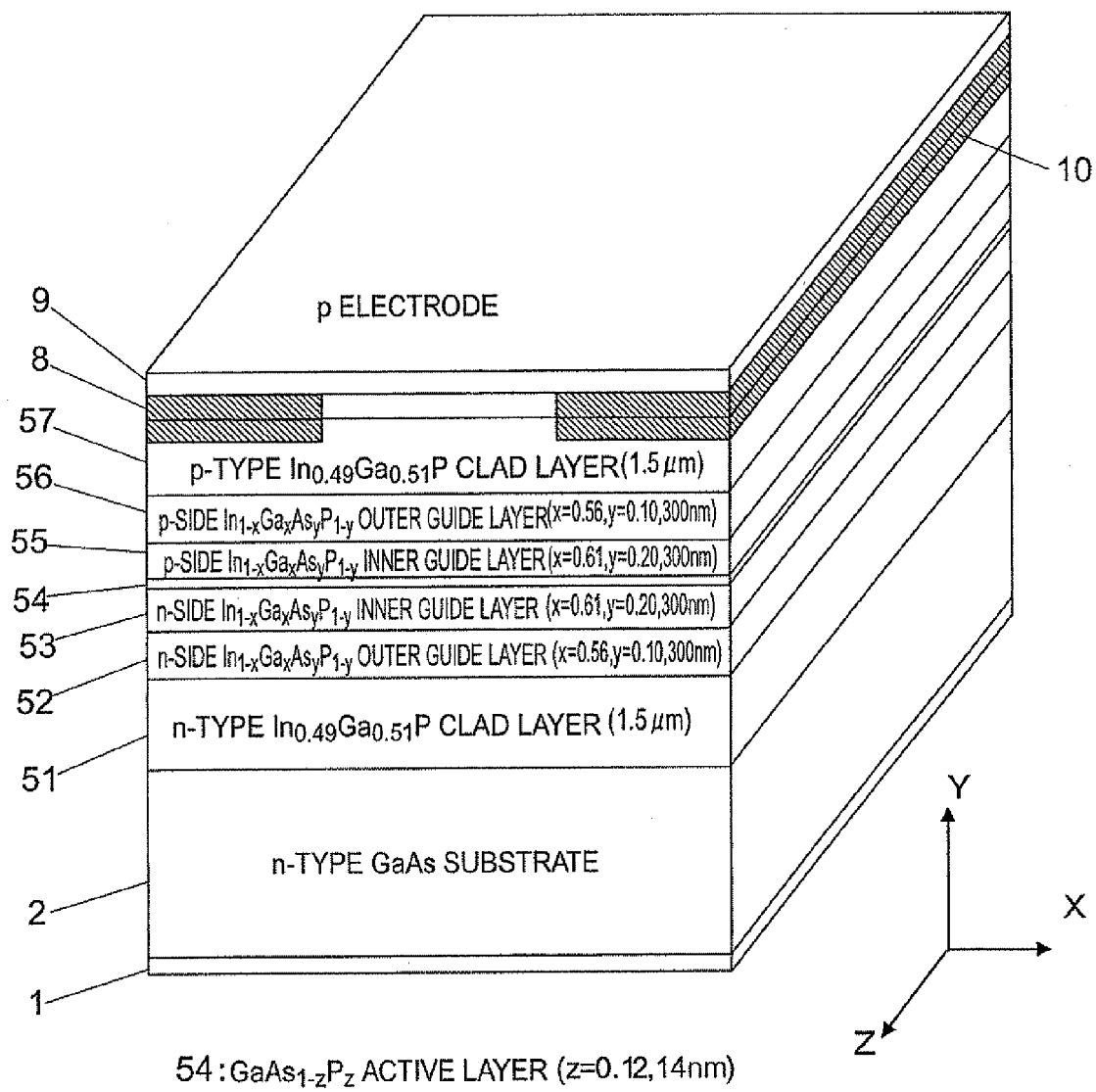
FIG. 18 is a perspective view showing a semiconductor laser apparatus according to a fifteenth embodiment of the present invention.

FIG. 18 is a perspective view that shows a fifteenth embodiment of the present invention, wherein a semiconductor laser apparatus with an oscillation wavelength band of 810 nm for example is illustrated. In FIG. 18, a detailed description of the same or like layers 1, 2, 8 through 10 as mentioned above is omitted.

In this case, the semiconductor laser apparatus includes, between the above-mentioned n-type GaAs substrate 2 and the proton injection region 10 in the order from the bottom to the top, an n-type $In_{0.49}Ga_{0.51}P$ clad layer 51, an n-side $In_{1-x}Ga_xAs_yP_{1-y}$ outer guide layer (n-side outer guide layer) 52, an n-side $In_{1-x}Ga_xAs_yP_{1-y}$ inner guide layer (n-side inner guide layer) 53, a $GaAs_{1-z}P_z$ active layer 54, a p-side $In_{1-x}Ga_xAs_yP_{1-y}$ inner guide layer (p-side inner guide layer) 55, a p-side $In_{1-x}Ga_xAs_yP_{1-y}$ outer guide layer (p-side outer guide layer) 56, and a p-type $In_{0.49}Ga_{0.51}P$ clad layer 57.

The n-type clad layer 51 has a layer thickness of 1.5 μm. The n-side outer guide layer 52 has a Ga composition ratio x of 0.56, an As composition ratio y of 0.10 and a layer thickness of 300 nm. The n-side inner guide layer 53 has a Ga composition ratio x of 0.61, an As composition ratio y of 0.20 and a layer thickness of 300 nm. The active layer 54 has a P composition ratio z of 0.12 and a layer thickness of 14 nm. The p-side inner guide layer 55 has a Ga composition ratio x of 0.61, an As composition ratio y of 0.20 and a layer thickness of 300 nm. The n-side outer guide layer 56 has a Ga composition ratio x of 0.56, an As composition ratio y of 0.10 and a layer thickness of 300 nm. The p-type clad layer 57 has a layer thickness of 1.5 μm.

In FIG. 18, the individual n-side and p-side guide layers are each composed of two layers, an outer layer and an inner layer (52, 53 and 55, 56), respectively, and each have the same layer thickness (300 nm). Here, note that the n-type clad layer 51 and the p-type clad layer 57 are each composed of an InGaP layer, but may be composed of an AlGaInP layer, as previously stated.

In general, in order to raise the electric conversion efficiency (optical output/input electric power), there are a method of increasing an optical output by improving a slope efficiency as in the above-mentioned first through fourteenth embodiments, and a method of reducing input electric power as in the fifteenth embodiment (FIG. 18) of the present invention.

The input electric power is denoted by the product of an operating current and an operating voltage, so when at least one of the operating current and the operating voltage is reduced, an electric conversion efficiency can be improved. Here, reference will be made, by way of example, to the case of reducing the operating voltage.

As shown in FIG. 18, in the semiconductor laser apparatus with each of the n-side and p-side guide layers being of a two-layer structure, in case where a voltage-current characteristic was simulated by using a resonator having a length of 1,000 μm and a stripe width of 1 μm, an operating voltage upon injection of a current of "20 mA" was "1.725 V".

On the other hand, the n-side guide layers 52, 53 and the p-side guide layers 55, 56, being of two-layer structures, respectively, were made into one-layer structures, i.e., an n-side $In_{1-x}Ga_xAs_yP_{1-y}$ guide layer (x=0.56, y=0.10, and layer thickness=600 nm) and a p-side $In_{1-x}Ga_xAs_yP_{1-y}$ guide layer (x=0.56, y=0.10, and layer thickness=600 nm), respectively. When a voltage-current characteristic was simulated under the above-mentioned condition, an operating voltage was "1.754 V (>1.725 V)".

Accordingly, it is found that the operating voltage is reduced by changing each guide layer from a one-layer structure into a two-layer structure.

As described above, according to the fifteenth embodiment (FIG. 18) of the present invention, the individual n-side and p-side guide layers are composed of a plurality of InGaAsP layers (52, 53 and 55, 56) having different As composition ratios, respectively, and the individual clad layers 51, 57 are composed of InGaP (or AlGaInP) layers, respectively. With such formation, junction voltages can be reduced, and hence the operating voltage can be reduced, whereby the electric conversion efficiency of the semiconductor laser apparatus can be raised.

Here, note that the individual two n-side and two p-side guide layers 52, 53, 55, 56 may not be intentionally doped with impurities in the course of crystal growth and wafer processing, or the individual outer layers thereof may be doped with impurities. That is, the n-side $In_{1-x}Ga_xAs_yP_{1-y}$ outer guide layer (x=0.56, y=0.10, and layer thickness=300 nm) 52 may be doped to form an n-type layer, and the p-side $In_{1-x}Ga_xAs_yP_{1-y}$ outer guide layer (x=0.56, y=0.10, and layer thickness=300 nm) 56 may be doped to form a p-type layer. With this, the operating voltage can be further reduced.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 51 through 57 are one example, and the present invention is not limited to this.

Embodiment 16

Figure 19:
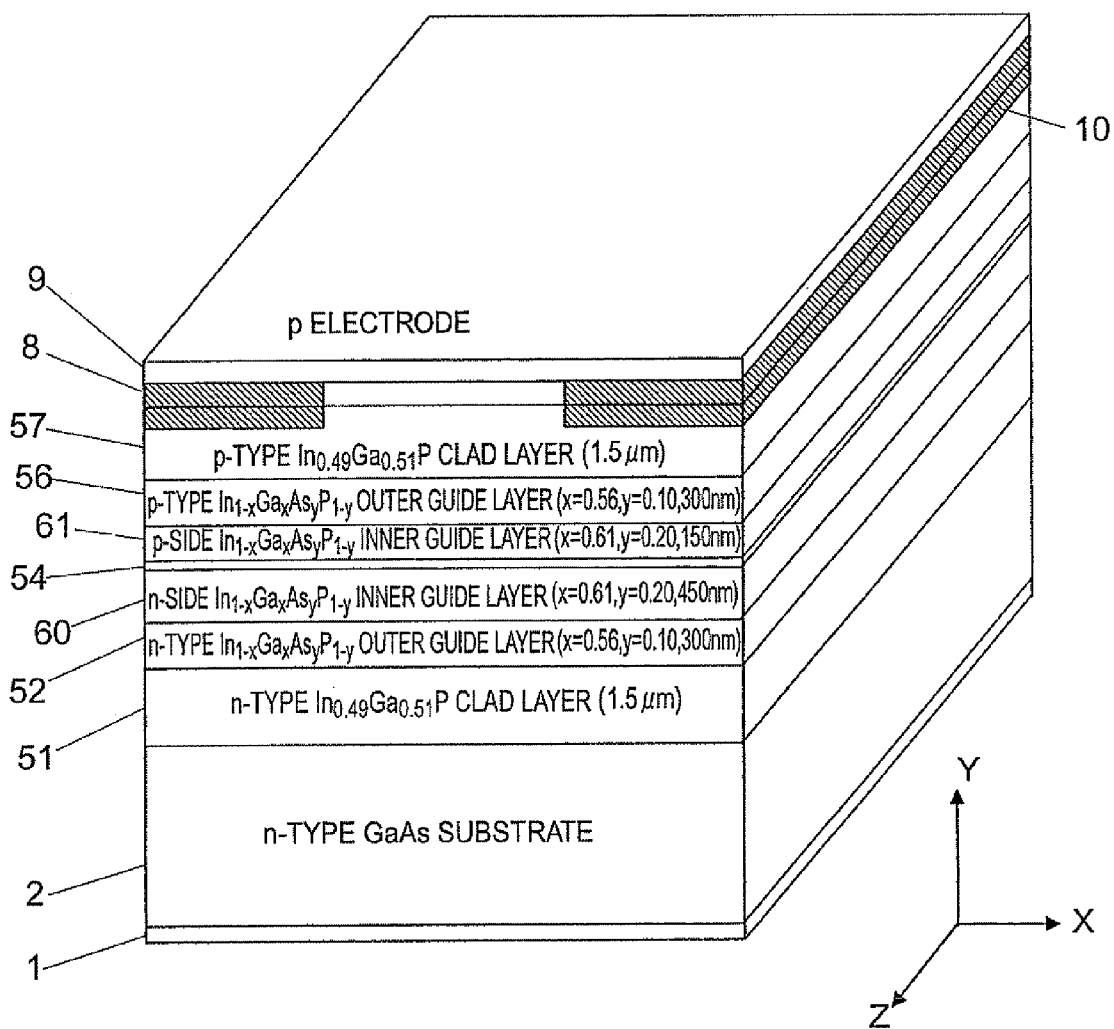
FIG. 19 is a perspective view showing a semiconductor laser apparatus according to a sixteenth embodiment of the present invention.

Although in the above-mentioned fifteenth embodiment (FIG. 18), the n-side guide layers 52, 53 and the p-side guide layers 55, 56 are respectively constructed to have the same layer thickness, the thickness (150 nm) of a p-side $In_{1-x}Ga_xAs_yP_{1-y}$ inner guide layer 61 may be set to be thinner than the thickness (450 nm) of an n-side $In_{1-x}Ga_xAs_yP_{1-y}$ inner guide layer 60, as shown in FIG. 19.

FIG. 19 is a perspective view that shows a sixteenth embodiment of the present invention, wherein a semiconductor laser apparatus with an oscillation wavelength band of 810 nm for example is illustrated. In FIG. 19, the same or like parts or elements as those described above (see FIG. 18) are identified by the same symbols while omitting a detailed description thereof.

In this case, the semiconductor laser apparatus includes, in place of the above-mentioned individual layers 53, 55, the n-side $In_{1-x}Ga_xAs_yP_{1-y}$ inner guide layer 60 and the p-side $In_{1-x}Ga_xAs_yP_{1-y}$ inner guide layer 61, respectively, which are different in their layer thickness from each other.

The n-side inner guide layer 60 has a Ga composition ratio x of 0.61, an As composition ratio y of 0.20 and a layer thickness of 450 nm, and the p-side inner guide layer 61 has a Ga composition ratio x of 0.61, an As composition ratio y of 0.20 and a layer thickness of 150 nm.

By setting the thickness (150 nm) of the p-side $In_{1-x}Ga_xAs_yP_{1-y}$ inner guide layer 61 thinner than the thickness (450 nm) of the n-side $In_{1-x}Ga_xAs_yP_{1-y}$ inner guide layer 60, as shown in FIG. 19, the center position of the active layer 54 is shifted to the side of the p-type clad layer 57, as in the above-mentioned first through fourteenth embodiment, so the carriers in the p-side guide layers 61, 56 decrease. As a result, the absorption of a laser beam by the carriers is decreased, and the slope efficiency is improved.

Here, in order to further reduce the operating voltage of the semiconductor laser apparatus, n-type doping and p-type doping may be applied to the n-type $In_{1-x}Ga_xAs_yP_{1-y}$ outer guide layer 52 and the p-type $In_{1-x}Ga_xAs_yP_{1-y}$ outer guide layer 56, respectively.

In addition, in FIG. 19, the refractive indexes of the individual n-side and p-side guide layers 52, 60, 61, 56 and the individual clad layers 51, 57 may all be set to the same value. This is due to the following reasons. That is, the individual n-side and p-side guide layers are formed of two-layer structures including inner and outer layers (52, 60 and 61, 56), and hence light is strongly confined within the individual inner guide layers 60, 61, so even if the center position of the active layer 54 is shifted in a manner as shown in FIG. 19, the optical confinement rate is not changed to any great extent.

However, as in the above-mentioned first through fourteenth embodiments, by setting the refractive index of one or both of the p-side guide layers 56, 61 of the two-layer structures to a higher value, or additionally by setting the refractive index of the n-type clad layer 51 to a higher value, it is possible to suppress the increase of a threshold current and at the same time to improve the slope efficiency. Besides, it is also possible to lower the operating voltage.

As described above, according to the sixteenth embodiment (FIG. 19) of the present invention, by forming the individual n-side and p-side guide layers from the plurality of InGaAsP layers having different As composition ratios (two-layer structure), and forming the individual clad layers 51, 57 from the InGaP (or AlGaInP) layers, respectively, junction voltages can be reduced, and hence the operating voltage can also be reduced, as in the above-mentioned fifteenth embodiment, whereby the electric conversion efficiency of the semiconductor laser apparatus can be raised.

In addition, the center position of the active layer 54 is made closer to the side of the p-type clad layer 57, and at the same time the refractive indexes of the p-type clad layer side guide layers 56, 61 are set to higher values, so the optical absorption in the individual guide layers 52, 60, 61, 56 can be decreased while suppressing the reduction of the optical confinement rate of the active layer 54, whereby the electric conversion efficiency of the semiconductor laser apparatus can be raised.

Further, the refractive index of the n-type clad layer 51 is set to a value that is higher than the refractive index of the p-type clad layer 57, so the optical absorption in the individual guide layers can be decreased while suppressing the reduction of the optical confinement rate of the active layer 54, and at the same time the optical absorption in the p-type clad layer 57 can also be decreased, whereby the electric conversion efficiency of the semiconductor laser apparatus can be raised.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 51, 52, 54, 56, 57, 60, 61 are one example, and the present invention is not limited to this.

Embodiment 17

Figure 20:
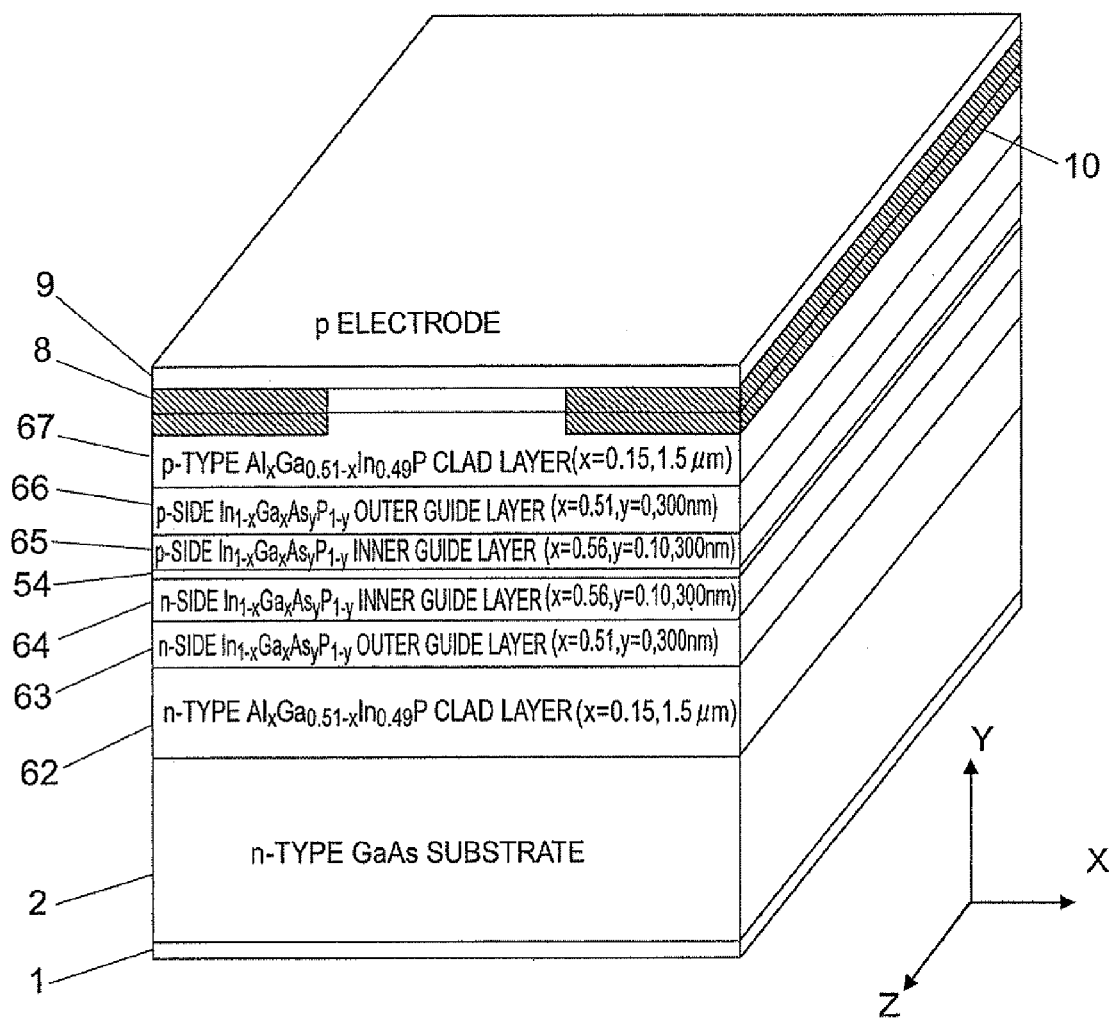
FIG. 20 is a perspective view showing a semiconductor laser apparatus according to a seventeenth embodiment of the present invention.

Although in the above-mentioned fifteenth and sixteenth embodiments (FIG. 18 and FIG. 19), the n-type $In_{0.49}Ga_{0.51}P$ clad layer 51 and the p-type $In_{0.49}Ga_{0.51}P$ clad layer 57 are used as individual clad layers, an n-type $Al_xGa_{0.51-x}In_{0.49}P$ clad layer 62 and a p-type $Al_xGa_{0.51-x}In_{0.49}P$ clad layer 67 may instead be used, as shown in FIG. 20.

FIG. 20 is a perspective view that shows a seventeenth embodiment of the present invention, wherein a semiconductor laser apparatus with an oscillation wavelength band of 810 nm for example is illustrated. In FIG. 20, a detailed description of the same or like layers 1, 2, 8 through 10, 54 as mentioned above (FIG. 18 and FIG. 19) is omitted.

In this case, the semiconductor laser apparatus includes, in place of the above-mentioned individual layers 51 through 53, 55 through 57 (FIG. 18), an n-type $Al_xGa_{0.51-x}In_{0.49}P$ clad layer 62, an n-side $In_{1-x}Ga_xAs_yP_{1-y}$ outer guide layer 63, an n-side $In_{1-x}Ga_xAs_yP_{1-y}$ inner guide layer 64, a p-side $In_{1-x}Ga_xAs_yP_{1-y}$ inner guide layer 65, a p-side $In_{1-x}Ga_xAs_yP_{1-y}$ outer guide layer 66, and a p-type $Al_xGa_{0.51-x}In_{0.49}P$ clad layer 67.

The n-type clad layer 62 has an Al composition ratio x of 0.15 and a layer thickness of 1.5 μm. The n-side outer guide layer 63 has a Ga composition ratio x of 0.51, an As composition ratio y of 0 and a layer thickness of 300 nm. The n-side inner guide layer 64 has a Ga composition ratio x of 0.56, an As composition ratio y of 0.10 and a layer thickness of 300 nm. The p-side inner guide layer 65 has a Ga composition ratio x of 0.56, an As composition ratio y of 0.10 and a layer thickness of 300 nm. The p-side outer guide layer 66 has a Ga composition ratio x of 0.51, an As composition ratio y of 0 and a layer thickness of 300 nm. The p-type clad layer 67 has an Al composition ratio x of 0.15 and a layer thickness of 1.5 μm.

In FIG. 20, all the individual n-side and p-side guide layers 63 through 66, which constitute two-layer structures each comprising an outer layer and an inner layer, have the same layer thickness (300 nm). By forming each of the individual n-side and p-side guide layers with a two-layer structure, as shown in FIG. 20, the reduction of the operating voltage can be achieved, as in the above-mentioned fifteenth and sixteenth embodiments.

In addition, each of the two n-side and two p-side guide layers 63 through 66 may be of undoped structure, but the n-side $In_{1-x}Ga_xAs_yP_{1-y}$ outer guide layer (x=0.56, y=0.10, and layer thickness=300 nm) 63 may be doped to form an n-type layer, and the p-side $In_{1-x}Ga_xAs_yP_{1-y}$ outer guide layer (x=0.56, y=0.10, and layer thickness=300 nm) 66 may be doped to form a p-type layer. With such structures, the further reduction of the operating voltage can be achieved.

As described above, according to the seventeenth embodiment (FIG. 20) of the present invention, the individual n-side and p-side guide layers are composed of a plurality of InGaAsP layers (63, 64 and 65, 66) (two-layer structures) with different As composition ratios, respectively, and the individual clad layers 62, 67 are composed of AlGaInP (or InGaP) layers, respectively, so junction voltages can be reduced, and hence the operating voltage can also be reduced, whereby the electric conversion efficiency of the semiconductor laser apparatus can be raised.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 54, 62 through 67 are one example, and the present invention is not limited to this.

Embodiment 18

Figure 21:
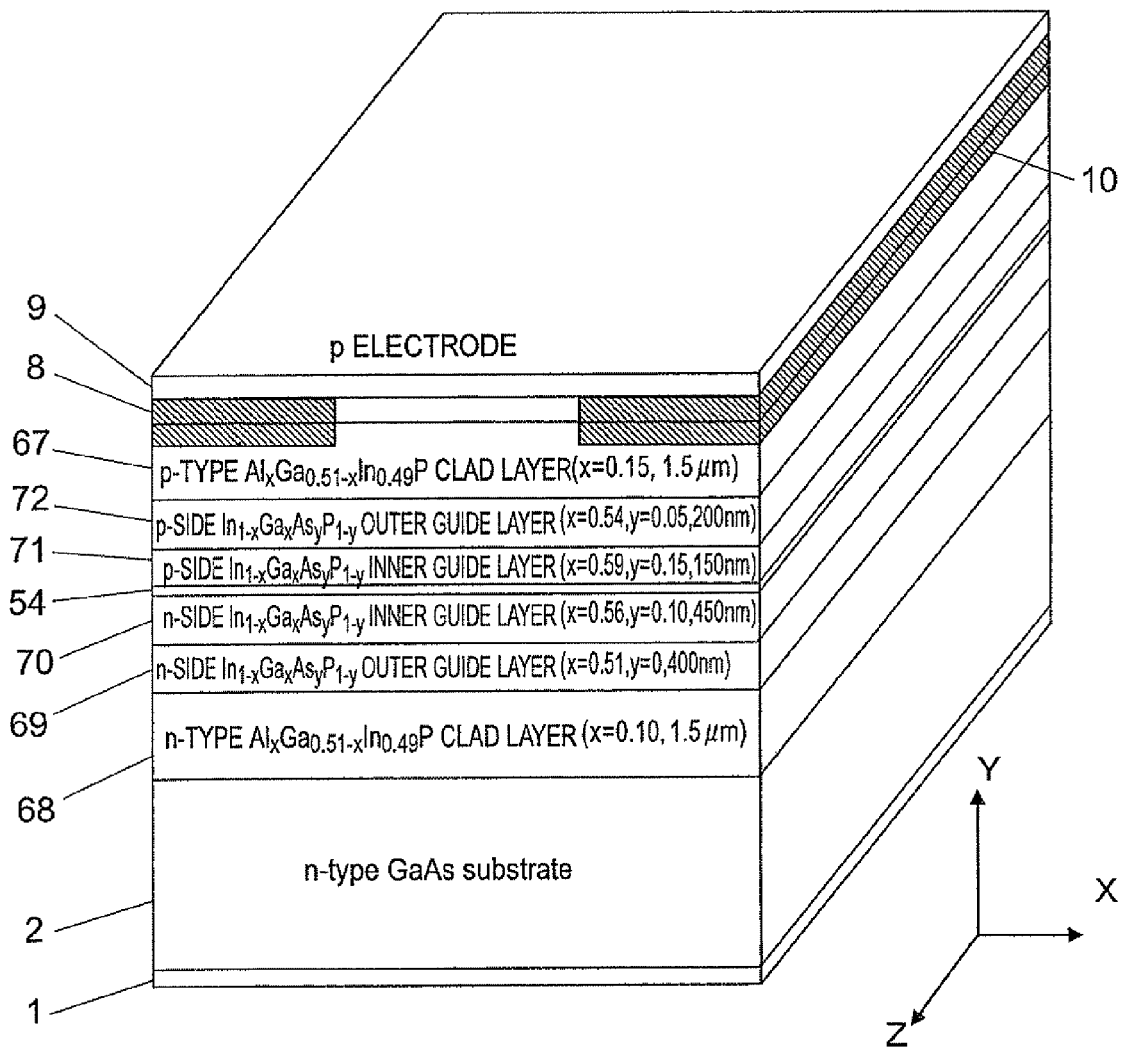
FIG. 21 is a perspective view showing a semiconductor laser apparatus according to an eighteenth embodiment of the present invention.

Although in the above-mentioned seventeenth embodiment (FIG. 20), all the individual guide layers 63 through 66 of the n-side and p-side guide layers each having a two-layer structure are constructed to have the same layer thickness (300 nm), the individual thicknesses (150 nm, 200 nm) of p-side guide layers 71, 72 may be set to be thinner than the individual thicknesses (400 nm, 450 nm) of n-side guide layers 69, 70, respectively, as shown in FIG. 21.

FIG. 21 is a perspective view that shows an eighteenth embodiment of the present invention, wherein a semiconductor laser apparatus with an oscillation wavelength band of 810 nm for example is illustrated. In FIG. 217 the same or like parts or elements as those described above (see FIG. 20) are identified by the same symbols while omitting a detailed description thereof.

In this case, the semiconductor laser apparatus includes, in place of the above-mentioned individual layers 62 through 66, an n-type $Al_xGa_{0.51-x}In_{0.49}P$ clad layer 68, an n-side $In_{1-x}Ga_xAs_yP_{1-y}$ outer guide layer 69, an n-side $In_{1-x}Ga_xAs_yP_{1-y}$ inner guide layer 70, a p-side $In_{1-x}Ga_xAs_yP_{1-y}$ inner guide layer 71, a p-side $In_{1-x}Ga_xAs_yP_{1-y}$ outer guide layer 72.

The n-type clad layer 68 has an Al composition ratio x of 0.10 and a layer thickness of 1.5 μm. The n-side outer guide layer 69 has a Ga composition ratio x of 0.51, an As composition ratio y of 0 and a layer thickness of 400 nm. The n-side inner guide layer 70 has a Ga composition ratio x of 0.56, an As composition ratio y of 0.10 and a layer thickness of 450 nm. The p-side inner guide layer 71 has a Ga composition ratio x of 0.59, an As composition ratio y of 0.15 and a layer thickness of 150 nm. The p-side outer guide layer 72 has a Ga composition ratio x of 0.54, an As composition ratio y of 0.05 and a layer thickness of 200 nm.

By setting the thicknesses (150 nm, 200 nm) of the inner and outer p-side guide layers 71, 72 thinner than the thicknesses (450 nm, 400 nm) of the inner and outer n-side guide layers 70, 69, respectively, as shown in FIG. 21, the center position of the active layer 54 is shifted to the side of the p-type clad layer 68, similarly as stated above, so the carriers in the individual p-side guide layers 71, 72 decrease. As a result, the absorption of a laser beam by the carriers is decreased, and the slope efficiency is improved.

In addition, the refractive indexes of the individual p-side guide layers 71, 72 are set to values that are higher than the refractive indexes of the individual n-side guide layers 69, 70, and at the same time the refractive index of the n-type clad layer 68 is set to a value that is higher than the refractive index of the p-type clad layer 67. As a result, the optical intensity distribution can be expanded to the n-type clad layer 68 without changing the optical confinement rate of the active layer 54, and the slope efficiency is improved, whereby a semiconductor laser of a low operating voltage can be achieved.

As described above, according to the eighteenth embodiment (FIG. 21) of the present invention, the center position of the active layer 54 is made closer to the side of the p-type clad layer 67, and at the same time the refractive indexes of the p-side guide layers 71, 72 are set to higher values, so the optical absorption in the individual guide layers 69 through 72 can be decreased while suppressing the reduction of the optical confinement rate of the active layer 54, whereby the electric conversion efficiency of the semiconductor laser apparatus can be raised.

In addition, the refractive index of the n-type clad layer 68 is also set to a higher value, so the optical absorption in the individual guide layers 69 through 72 can be decreased while suppressing the reduction of the optical confinement rate of the active layer 54, and at the same time the optical absorption in the p-type clad layer 67 can also be decreased, whereby the electric conversion efficiency of the semiconductor laser apparatus can be raised.

Further, the individual n-side and p-side guide layers are composed of a plurality of InGaAsP layers with different As composition ratios, respectively, and the individual clad layers 67, 68 are composed of AlGaInP (or InGaP) layers, respectively, so junction voltages can be reduced, and hence the operating voltage can also be reduced, whereby the electric conversion efficiency of the semiconductor laser apparatus can be further enhanced.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 54, 67 through 72 are one example, and the present invention is not limited to this.

Embodiment 19

Figure 22:
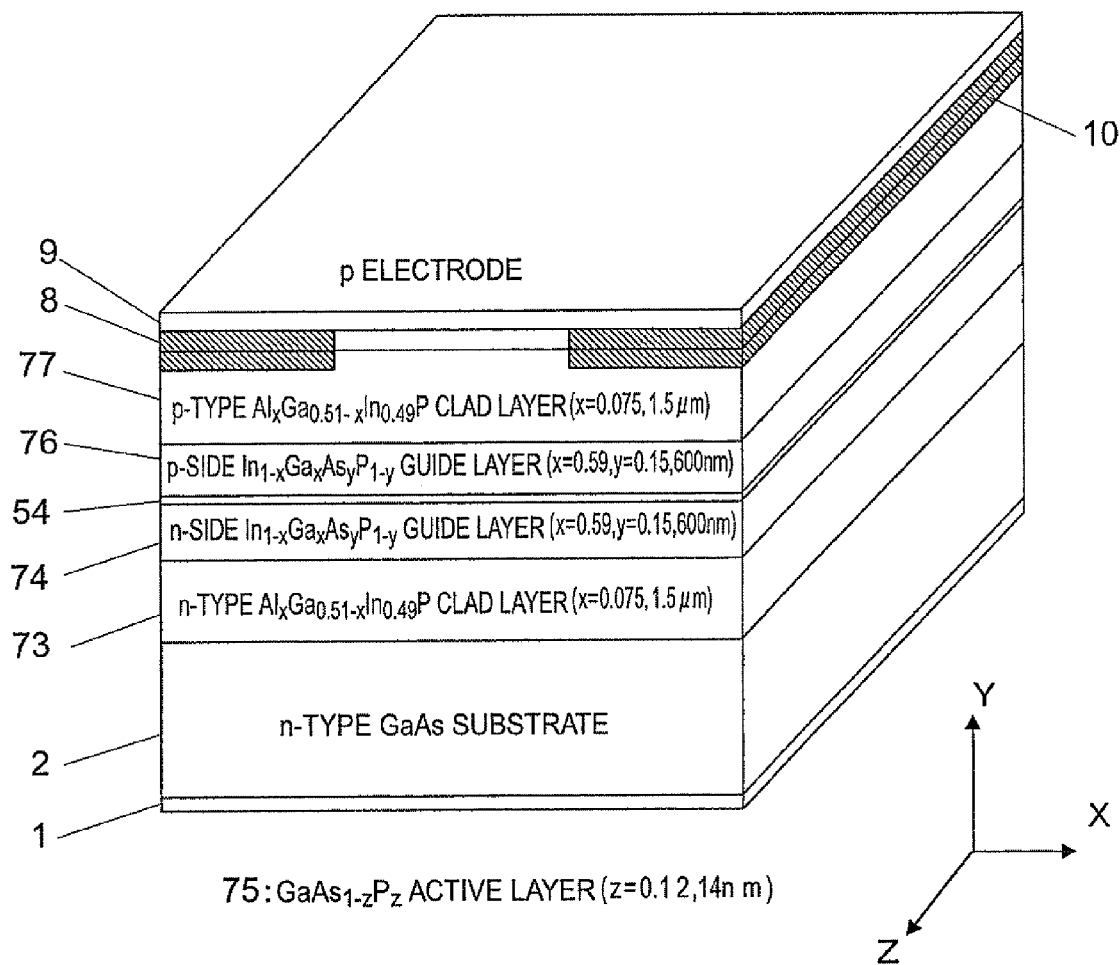
FIG. 22 is a perspective view showing a semiconductor laser apparatus according to a nineteenth embodiment of the present invention.

Although in the above-mentioned respective embodiments, the Al composition ratios of the individual clad layers are set to values equal to or larger than 0.1, individual guide layers 74, 76 may be composed of InGaAsP layers, and the Al composition ratios of individual clad layers (AlGaInP) 73, 77 may be set to values less than 0.1, as shown in FIG. 22.

FIG. 22 is a perspective view that shows a nineteenth embodiment of the present invention, wherein a semiconductor laser apparatus with an oscillation wavelength band of 810 nm for example is illustrated. In FIG. 22, the same or like parts or elements as those described above (see FIG. 7 and FIG. 21) are identified by the same symbols while omitting a detailed description thereof.

In this case, the semiconductor laser apparatus includes, in addition to the above-mentioned individual layers 1, 2, 8 through 10, 54, an n-type $Al_xGa_{0.51-x}In_{0.49}P$ clad layer 73, an n-side $In_{1-x}Ga_xAs_yP_{1-y}$ guide layer 74, a p-side $In_{1-x}Ga_x$-$As_yP_{1-y}$ guide layer 76 and a p-type $Al_xGa_{0.51-x}In_{0.49}P$ clad layer 77.

The n-type clad layer 73 has an Al composition ratio x of 0.075 and a layer thickness of 1.5 µm. The n-side guide layer 74 has a Ga composition ratio x of 0.59, an As composition ratio y of 0.15 and a layer thickness of 600 nm. The p-side guide layer 76 has a Ga composition ratio x of 0.59, an As composition ratio y of 0.15 and a layer thickness of 600 nm. The p-type clad layer 77 has an Al composition ratio x of 0.075, and a layer thickness of 1.5 µm.

By composing each of the guide layers 74, 76 with an InGaAsP layer, as shown in FIG. 22, the reduction of an operating voltage can be achieved, and by composing each of the clad layers 73, 77 with an AlGaInP layer of an Al composition ratio x of 0.075 (<0.1), as shown in FIG. 22, an angle of divergence in a vertical direction can be decreased.

As described above, according to the nineteenth embodiment (FIG. 22) of the present invention, the n-type clad layer side guide layer 74 and the p-type clad layer side guide layer 76 are each composed of an InGaAsP layer, and the n-type clad layer 73 and the p-type clad layer 77 are each composed of an AlGaInP layer of an Al composition ratio x=0.075 (<0.1). Thus, the reduction of the operating voltage can be achieved, and the angle of divergence in the vertical direction can be decreased, whereby the electric conversion efficiency of the semiconductor laser apparatus can be raised.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 54, 73, 74, 76, 77 are one example, and the present invention is not limited to this.

Embodiment 20

Figure 23:
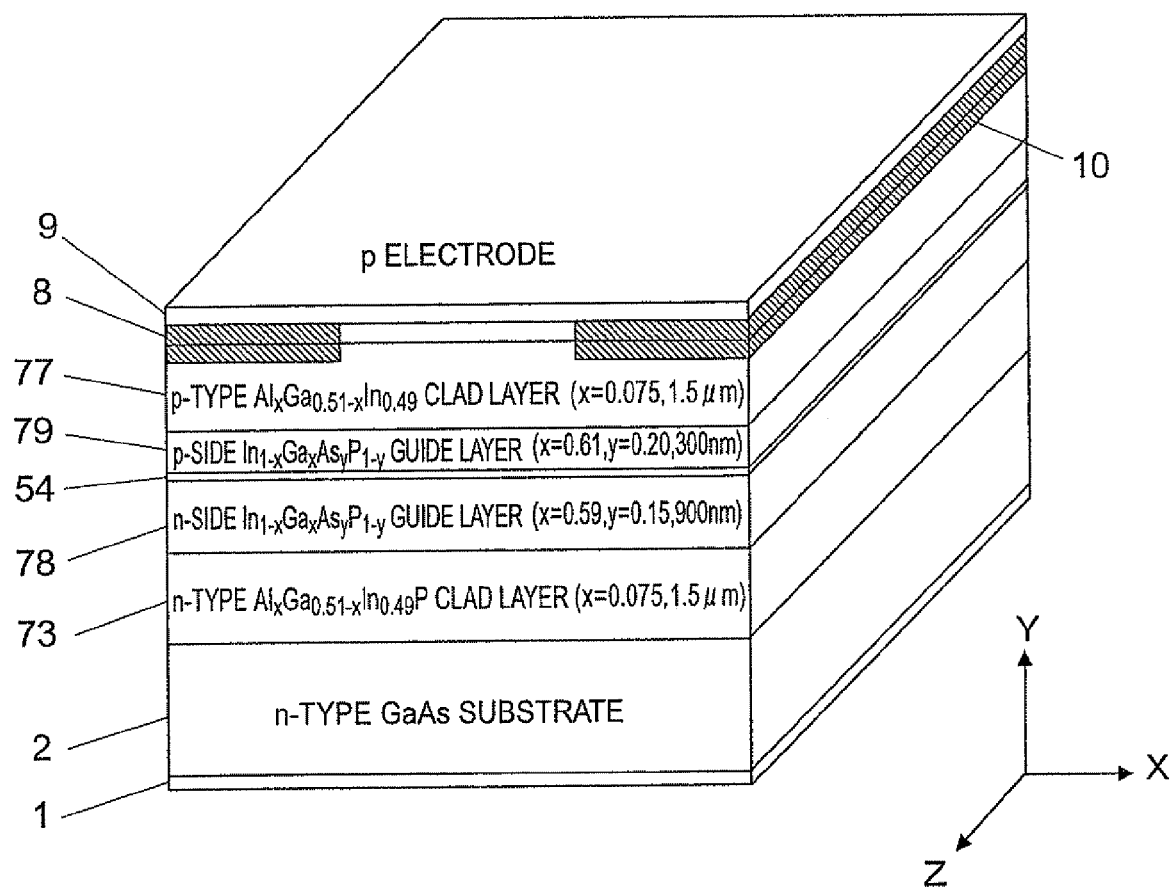
FIG. 23 is a perspective view showing a semiconductor laser apparatus according to a twentieth embodiment of the present invention.

Although in the above-mentioned nineteenth embodiment (FIG. 22), the individual guide layers 74, 76 are set to the same layer thickness (600 nm), the thickness (300 nm) of a p-side guide layer 79 may be set to be thinner than the thickness (900 nm) of an n-side guide layer 78, as shown in FIG. 23.

FIG. 23 is a perspective view that shows a twentieth embodiment of the present invention, wherein a semiconductor laser apparatus with an oscillation wavelength band of 810 nm for example is illustrated. In FIG. 23, the same or like parts or elements as those described above (see FIG. 22) are identified by the same symbols while omitting a detailed description thereof.

In this case, the semiconductor laser apparatus includes, in place of the above-mentioned individual layers 74, 76, an n-side $In_{1-x}Ga_xAs_yP_{1-y}$ guide layer 78 and a p-side $In_{1-x}Ga_x$-$As_yP_{1-y}$ guide layer 79.

The n-side guide layer 78 has a Ga composition ratio x of 0.59, an Al composition ratio y of 0.15 and a layer thickness of 900 nm, and the p-side guide layer 79 has a Ga composition ratio x of 0.61, an Al composition ratio y of 0.20 and a layer thickness of 300 nm. In addition, the refractive index of the p-side guide layer 79 is set to a value that is higher than the refractive index of the n-side guide layer 78.

In the semiconductor laser apparatus of FIG. 23, the thickness (300 nm) of the p-side guide layer (InGaAsP) 79 is set to be thinner than the thickness (900 nm) of the n-side guide layer (InGaAsP) 78, and hence, the center position of the active layer 54 is shifted to the side of the p-type clad layer 77, so the carriers in the p-side guide layer 79 decrease. As a result, the absorption of a laser beam by the carriers is decreased, and the slope efficiency is improved.

In addition, the refractive index of the p-side $In_{1-x}Ga_x$-$As_yP_{1-y}$ guide layer (x=0.61, y=0.20) 79 is set to a value that is higher than the refractive index of the n-side $In_{1-x}Ga_x$-$As_yP_{1-y}$ guide layer (x=0.59, y=0.15) 78, so an optical intensity distribution becomes asymmetric while being biased to the p-side guide layer 79, and the reduction of an optical confinement rate is not induced. As a result, a semiconductor laser apparatus with high slope efficiency can be achieved without causing an increase in a threshold current.

As described above, according to the twentieth embodiment (FIG. 23) of the present invention, the center position of the active layer 54 is made closer to the side of the p-type clad layer 77, and at the same time the refractive index of the p-type clad layer side guide layer 79 is set to a higher value, so the optical absorption in the individual guide layers 78, 79 can be decreased while suppressing the reduction of the optical confinement rate of the active layer 54, whereby the electric conversion efficiency of the semiconductor laser apparatus can be raised.

Although a proton injection method is shown as a current constriction method for raising oscillation efficiency, it is needless to say that the present invention is not limited to such a method, but there can be applied a stripe formation method using insulating films, a method using a waveguide such as ridge formation, or a method of inserting a current block layer such as embedding an n-GaAs semiconductor layer, etc.

In addition, the thickness and composition of the above-mentioned individual layers 54, 43, 77 through 79 are one example, and the present invention is not limited to this.

While the invention has been described in terms of preferred embodiments, those skilled in the art will recognize that the invention can be practiced with modifications within the spirit and scope of the appended claims.

What is claimed is:

1. A semiconductor laser apparatus including:
an n-type cladding layer, an n-type cladding layer side guide layer, an active layer, a p-type cladding layer side guide layer, and a p-type cladding layer, wherein
electrons and holes are injected into said active layer, transverse to said active layer, through said n-type cladding layer side guide layer and said p-type cladding layer side guide layer,
said n-type cladding layer side guide layer and said p-type cladding layer side guide layer are not doped with impurities in the course of crystal growth and wafer processing,
said p-type cladding layer side guide layer is thinner than said n-type cladding layer side guide layer, and
the refractive index of said p-type cladding layer side guide layer is higher than the refractive index of said n-type cladding layer side guide layer.

2. The semiconductor laser apparatus as set forth in claim 1, wherein the refractive index of said n-type cladding layer is higher than the refractive index of said p-type cladding layer.

3. The semiconductor laser apparatus as set forth in claim 1, wherein
said n-type cladding layer side guide layer and said p-type cladding layer side guide layer are each composed of a plurality of InGaAsP layers having As composition ratios different from one another, and
said n-type cladding layer and said p-type cladding layer are each composed of an InGaP layer or an AlGaInP layer.

* * * * *